US 8,115,926 B2

(12) United States Patent
Straaijer

(10) Patent No.: US 8,115,926 B2
(45) Date of Patent: Feb. 14, 2012

(54) INSPECTION METHOD AND APPARATUS, LITHOGRAPHIC APPARATUS, LITHOGRAPHIC PROCESSING CELL, AND DEVICE MANUFACTURING METHOD TO MEASURE A PROPERTY OF A SUBSTRATE

(75) Inventor: Alexander Straaijer, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 312 days.

(21) Appl. No.: 12/256,780

(22) Filed: Oct. 23, 2008

(65) Prior Publication Data
US 2009/0168062 A1 Jul. 2, 2009

Related U.S. Application Data

(60) Provisional application No. 60/996,024, filed on Oct. 25, 2007.

(51) Int. Cl.
*G01J 4/00* (2006.01)
(52) U.S. Cl. ........................................................ 356/364
(58) Field of Classification Search ........... 356/364–370
See application file for complete search history.

(56) References Cited

U.S. PATENT DOCUMENTS

| 5,166,752 | A  | * | 11/1992 | Spanier et al. ................ 356/369 |
| 5,335,066 | A  | * | 8/1994  | Yamada et al. ............... 356/364 |
| 5,880,838 | A  |   | 3/1999  | Marz et al. |
| 6,031,615 | A  |   | 2/2000  | Meeks et al. |
| 6,921,916 | B2 |   | 7/2005  | Adel et al. |
| 6,965,431 | B2 |   | 11/2005 | Vo-Dinh et al. |
| 2005/0275845 | A1 | * | 12/2005 | Finarov ......................... 356/445 |
| 2006/0066854 | A1 |   | 3/2006  | Meeks et al. |
| 2006/0066868 | A1 |   | 3/2006  | Opsal |
| 2007/0127016 | A1 | * | 6/2007  | Meeks et al. ............... 356/237.2 |
| 2007/0296973 | A1 |   | 12/2007 | Kiers et al. |
| 2008/0198380 | A1 |   | 8/2008  | Straaijer et al. |

FOREIGN PATENT DOCUMENTS

| EP | 1 628 164 A2  | 2/2006  |
| JP | 05-157521 A   | 6/1993  |
| JP | 2002-365232 A | 12/2002 |
| JP | 2006-509219 A | 3/2006  |
| JP | 2006-519395 A | 8/2006  |

OTHER PUBLICATIONS

Written Opinion mailed Sep. 21, 2009 for Singapore Patent Application No. 200807879-2, 6 pgs.
European Search Report and Written Opinion mailed May 25, 2009 for Application No. 08253455.3-2204 / 2053349, 11 pgs.
Partial European Search Report mailed Mar. 3, 2009 for Application No. 08253455.3-2204 / 2053349, 6 pgs.

(Continued)

*Primary Examiner* — Tarifur Chowdhury
*Assistant Examiner* — Tara S Pajoohi
(74) *Attorney, Agent, or Firm* — Sterne, Kessler, Goldstein & Fox P.L.L.C

(57) ABSTRACT

A system is configured to measure two separately polarized beams upon diffraction from a substrate in order to determine properties of the substrate. Circularly or elliptically polarized light sources are passed via a fixed phase retarder in order to change the phase of one of two orthogonally polarized radiation beams with respect to the two beams. The relative phases of the two radiation beams and other features of the beams are measured in a detector to provide information on the properties of the substrate surface.

25 Claims, 14 Drawing Sheets

OTHER PUBLICATIONS

Yanyan Chen et al., "Optimization of Off-null Ellipsometry for Optical Biosensor Applications", *Engineering in Medicine and Biology Society*, IEEE-EMBS 2005, 27th Annual Conference, Shanghai, China, Jan. 1, 2005, pp. 682-685.

First Office Action from the State Intellectual Property Office of People's Republic of China, for Application No. 200810188786.9, issued Jul. 30, 2010, 2 pages.

English language Abstract of Japanese Patent Publication No. 05-157521 A, Japanese Patent Office, dated Jun. 22, 1993; 1 page.

English language Abstract of Japanese Patent Publication No. 2002-365232 A, Japanese Patent Office, dated Dec. 18, 2002; 1 page.

English translation of Japanese Notice of Reasons for Rejection directed to related Japanese Patent Application No. 2008-275692, mailed Apr. 1, 2011; 3 pages.

* cited by examiner

Fig. 8
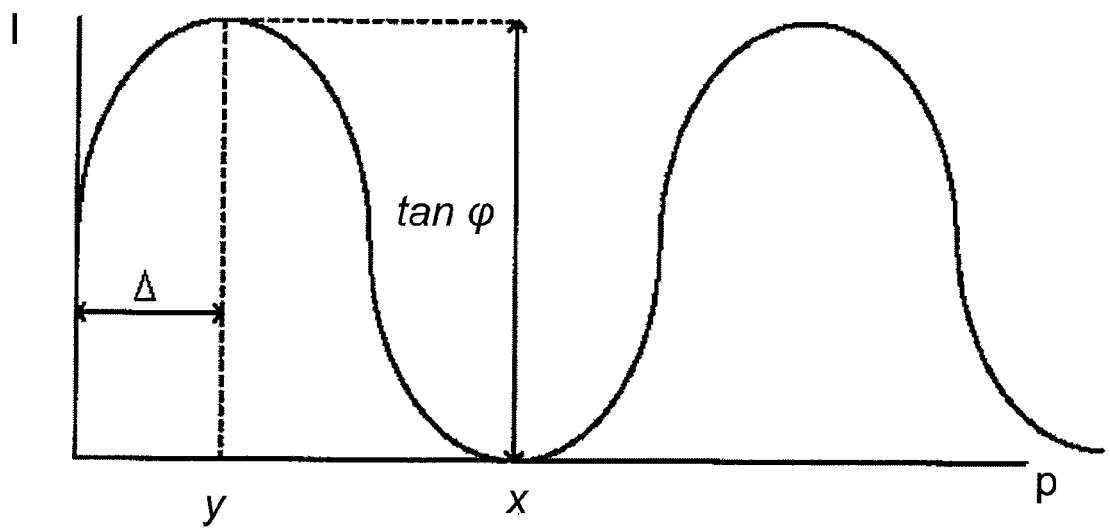
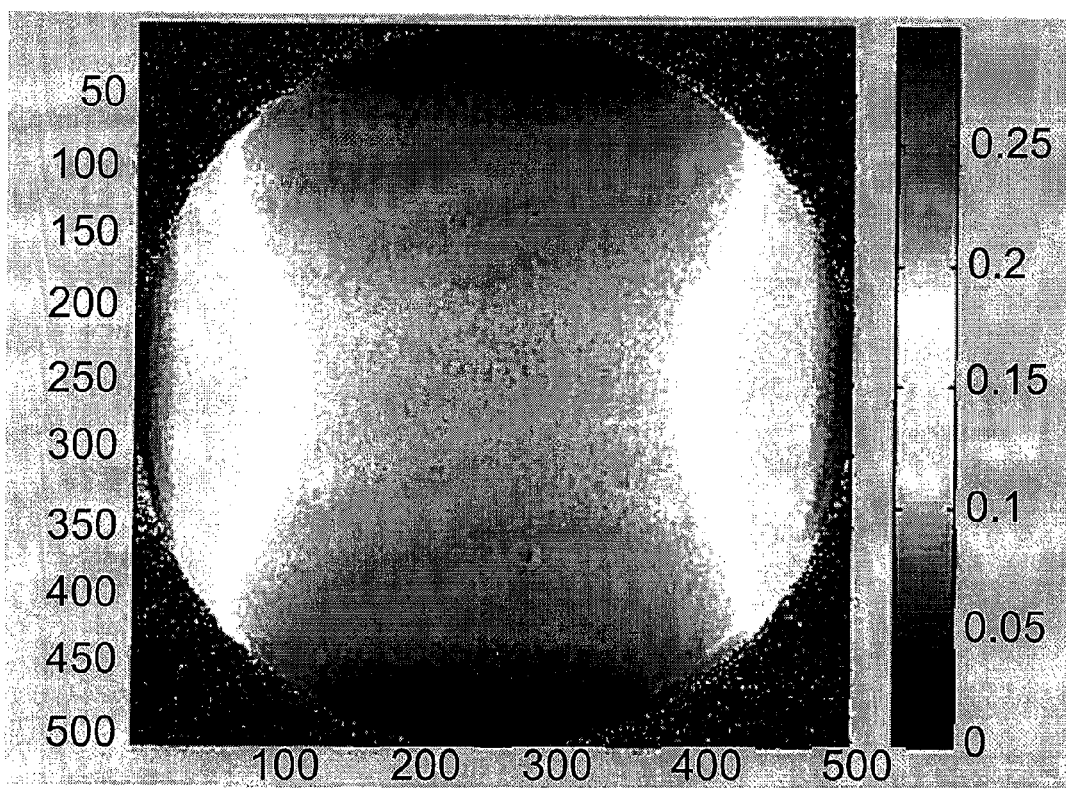
Fig. 9

INSPECTION METHOD AND APPARATUS, LITHOGRAPHIC APPARATUS, LITHOGRAPHIC PROCESSING CELL, AND DEVICE MANUFACTURING METHOD TO MEASURE A PROPERTY OF A SUBSTRATE

CROSS REFERENCE TO RELATED APPLICATIONS

This application claims benefit under 35 U.S.C. §119(e) to U.S. Provisional Patent Application No. 60/996,024, filed Oct. 25, 2007, which is incorporated by reference herein in its entirety.

FIELD

The present invention relates to methods of inspection usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is desirable to measure parameters of the patterned substrate, for example the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate may be determined. This may be done, for example, by comparing the reflected beam with data stored in a library of known measurements associated with known substrate properties. Two main types of scatterometers are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Although scatterometry is a relatively quick form of analysis of a surface, measuring only the intensity of scattered radiation may not achieve a desired preciseness of measurement, as it may not take into account the different behavior of radiation that is polarized in various directions. For example, if the substrate object that is being measured is in the form of a grating that is aligned with one polarization direction, radiation polarized in that direction will scatter in a different manner from radiation polarized in the orthogonal direction. To take polarization directions into account, an ellipsometric system has been envisaged to measure certain parameters of orthogonally polarized beams.

FIG. 4 shows an example of an ellipsometric sensor (or an ellipsometer) that has been envisaged to take into account the above. Illumination radiation from source P is reflected from a structure 30 on a target portion of a substrate W and on its return journey from the substrate, it is linearly polarized along one of the two eigen-polarizations of three beamsplitters that are present in the sensor (the eigen-polarizations being measured with respect to the x- or y-direction as shown in FIG. 4). A first beamsplitter N-PBS reflects part of the illumination to two further beamsplitters: one beamsplitter 80 sends part of the illumination to an imaging branch; and another beamsplitter 82 sends part of the illumination to a focus branch. The first beamsplitter N-PBS is a non-polarizing beamsplitter that directs the rest of the beam to a camera CCD. Having passed through the non-polarizing beamsplitter N-PBS, the polarized beam passes through a phase modulator 90 whose ordinary and extraordinary axes have been positioned at 45° with respect to the x- and y-directions. Subsequently, the beam is divided into its respective x- and y-polarization orientations using a Wollaston prism 50 and impinges on a camera CCD. The relative intensities of the polarized beams are used to determine the relative polarization orientations of the different parts of the beam. From the relative polarization orientations, the effect of the structure 30 on the beam as a whole can be determined. From the effect that structure 30 has on the beam, the properties of the structure itself can be determined.

U.S. Pat. No. 5,880,838 to Marx et al., which is incorporated by reference herein in its entirety, also describes the measurement of a structure on a substrate using ellipsometry, wherein the measurement system is called polarization quadrature measurement (PQM). This document describes focusing a polarized beam of light (with transverse electric TE and transverse magnetic TM fields) onto the structure. The TM and TE fields are affected differently by the diffraction off the structure. The TE field may be used as a reference to analyze the phase and amplitude changes in the TM field. The relationship between phases and amplitudes of the TE and TM fields is dependent on the structural parameters (e.g., the depth of a hole or the height of a grating bar or the pitch of a grating) of the structure. By measuring this relationship, therefore, the structural parameters may be determined.

Rather than just measuring the intensity variation within an illumination beam, generally, ellipsometry can be used to measure the state of polarization of scattered light. Ellipsometry measures two parameters: a phase difference ($\Delta$) between two differently polarized beams and an amplitude ratio (tan $\psi$) of two polarized beams. With these two parameters, any polarization state of a purely polarized beam may be described.

Specifically, if an incident beam has both s and p polarizations, the reflected beam will have reflectance coefficients $R_p$ and $R_s$. Delta ($\Delta$) is the phase difference between the reflectance coefficients $R_p$ and $R_s$ as given in equation (1) below.

The intensity of the received beam is proportional to the sum of the amplitudes, taking into account the angle of their relative polarization. For example, if the polarizations of both $R_p$ and $R_s$ are aligned in the same orientation, the intensity of the received beam is at a maximum. If the two amplitudes are in orthogonal orientations, they cancel each other out and the intensity is at a minimum. The angle between the two polarization directions (or orientations) is ψ and so the relationship between ψ and $R_p$ and $R_s$ can be defined by equation (2).

$$\Delta = \arg(R_p - R_s) \qquad (1)$$

$$\tan \psi = R_p/R_s \qquad (2)$$

FIG. 8 shows the relationship between these two parameters. Specifically, FIG. 8 shows the intensity variation in one pixel as a function of phase difference between s and p that is imposed by phase modulator 90 of FIG. 4. I is the intensity of the beam and P is the overall polarization of $R_p$ and $R_s$. Assuming the two amplitudes are the same (i.e., $R_p = R_s$ and ψ=45°), the intensity of the overall beam is at a minimum at point x because the polarization directions cancel each other out. At point y, the intensity is at a maximum, indicating that the polarization directions are aligned.

The overall intensity shown in FIG. 8 is modulated, demonstrating that the amplitudes (being the same) cancel each other out to a greater or lesser extent and so the relative phase of the two beams can be monitored as changing accordingly (as dictated by the phase modulator 90).

A system such as that shown in FIG. 4, which incorporates a phase modulator 90 (or phase shifters), has the following specific features:

1. The phase shifts that are applied to the light may need to be known exactly because any inaccuracies in these phase shifts may result in the same inaccuracy in Δ. It is desirable to know the relationship between intensity and phase in order for the structure to be accurately determined.

2. Phase modulators are wavelength-dependent, which means that phase modulators may have to be recalibrated for each wavelength that is used.

3. With phase modulators, two or more phase shifts are applied to each beam of light at a specific wavelength. The intensities of the differently shifted beams may have to be re-measured for each shift, taking significant amounts of time.

4. Using a phase shifter for analysis of an object on a substrate means that an image of the object may need to be recorded for each change in phase, causing the data-gathering step to be longer than desired. This is not desirable when a quick analysis is desired so that subsequent substrates may be corrected if an error in alignment, for instance, is found.

Two potential solutions to the use of the phase modulator have been proposed. Both have, as their aim, obtaining four differently polarized reflected sub-beams from a single incident beam in order to measure, from a measured intensity of each sub-beam, a difference in amplitude and phase of the four known polarizations. The first potential solution obtains this result by having the reflected beam pass through at least two polarizing beamsplitters arranged at 90° with respect to each other such that a radiation beam is split into two orthogonally polarized sub-beams and each of those polarized sub-beams is subsequently split at a 90° angle into mutually orthogonally polarized sub-sub-beams. All four sub-beams are therefore at 0°, 90°, 180°, and 270° polarization angles (with respect to each other). Wollaston prisms and the like are also used to split the beam into sub-beams, and each beam polarized by a different angle. The second potential solution passes a beam through a single polarizing device that has four quadrants, each quadrant with a polarizer having a different polarizing angle such that the beam is effectively divided into four quadrants, each with polarization in a different direction (e.g., 0°, 45°, 135°, and 180°). In the potential solutions described above, separate sub-beams of different polarizations are compared using the same or different cameras and the effect of the object on the substrate is compared for the different polarization angles. Analysis of the image by the camera gives rise to the characteristics of the structure from which the radiation beam has been reflected.

However, the solutions described above incorporate several different devices, each of which may have to be calibrated and which may absorb a certain amount of the radiation beam each time the beam passes through it. Furthermore, several devices in series may exacerbate a small error in the beam diffracted from the structure.

SUMMARY

It is desirable to provide an ellipsometric function in a scatterometer such that phase difference and amplitude of a beam diffracted from a structure may be measured in ranges of wavelengths without using known phase modulators, and without incorporating additional hardware.

According to an aspect of the invention, there is provided an inspection apparatus, a lithographic apparatus and a lithocell configured to measure a property of a substrate, the inspection apparatus including a radiation source configured to supply a radiation beam; an optical element configured to focus the radiation beam onto a substrate at a range of incident and azimuth angles such that the radiation beam reflects from the substrate; a polarizing device configured to polarize the radiation beam into two different polarization directions; a phase-shifter configured to retard a first polarization direction by a predetermined amount so as to impose a fixed phase shift on the reflected radiation beam; and, a detector system configured to simultaneously detect an angle-resolved spectrum of the two polarization directions of the radiation beam.

According to another aspect of the invention, there is provided a method of measuring a property of a substrate, the method including: providing a radiation beam with elliptical polarization; reflecting the radiation beam off the surface of a substrate; splitting the reflected radiation beam into first and second orthogonally polarized sub-beams; shifting the phase of one of the sub-beams by a fixed amount with respect to the second sub-beam; and, simultaneously detecting both sub-beams.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 8 depicts a relationship between intensity and polarization of a beam reflected from a structure.

FIGS. 9 to 12 depict measurement of ellipsometric data according to an embodiment of the present invention.

Figure 1A:
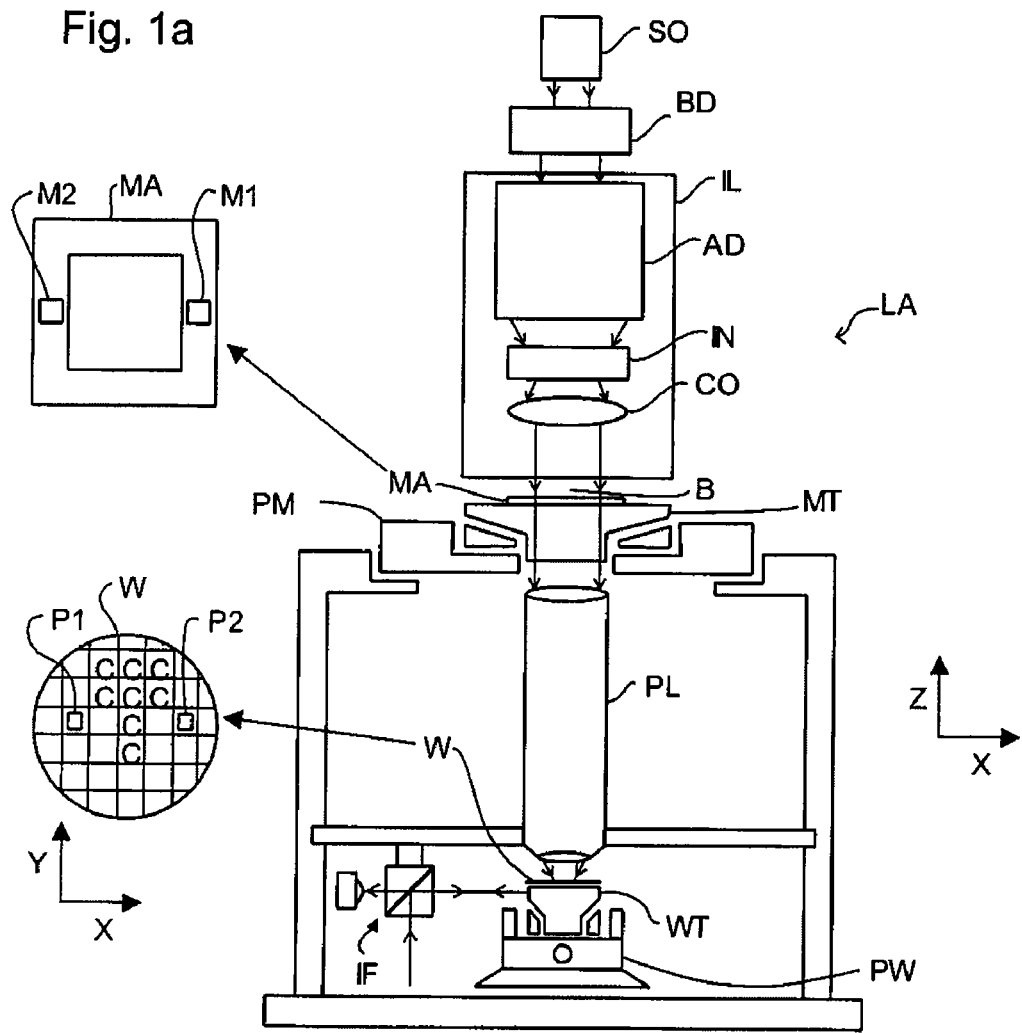
FIG. 1a depicts a lithographic apparatus in accordance with an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Overview

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1a schematically depicts a lithographic apparatus. The apparatus includes an illumination system (illuminator) IL configured to condition a radiation beam B (e.g., UV radiation or EUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and, a projection system (e.g., a refractive projection lens system) PL configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions.

The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index (e.g., water) so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1a, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g., mask) MA, the radiation beam B passes through the projection system PL, which focuses the beam onto a target portion C of the substrate W. With the aid of the second positioner PW and position sensor IF (e.g., an interferometric device, linear encoder, 2-D encoder, or capacitive sensor), the substrate table WT can be moved accurately (e.g., so as to position different target portions C in the path of the radiation beam B). Similarly, the first positioner PM and another position sensor (which is not explicitly depicted in FIG. 1a) can be used to accurately position the patterning device (e.g., mask) MA with respect to the path of the radiation beam B (e.g., after mechanical retrieval from a mask library, or during a scan). In general, movement of the support structure (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure (e.g., mask table) MT may be connected to a short-stroke actuator only, or may be fixed. Patterning device (e.g., mask) MA and substrate W may be aligned using mask alignment marks M1 and M2 and substrate alignment marks P1 and P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the x- and/or y-direction so that a different target portion C can be exposed. In step mode, the maximum size of the exposure field limits the size of the target portion C imaged in a single static exposure.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type referred to above.

Combinations and/or variations of the above described modes of use or entirely different modes of use may also be employed.

Figure 1B:
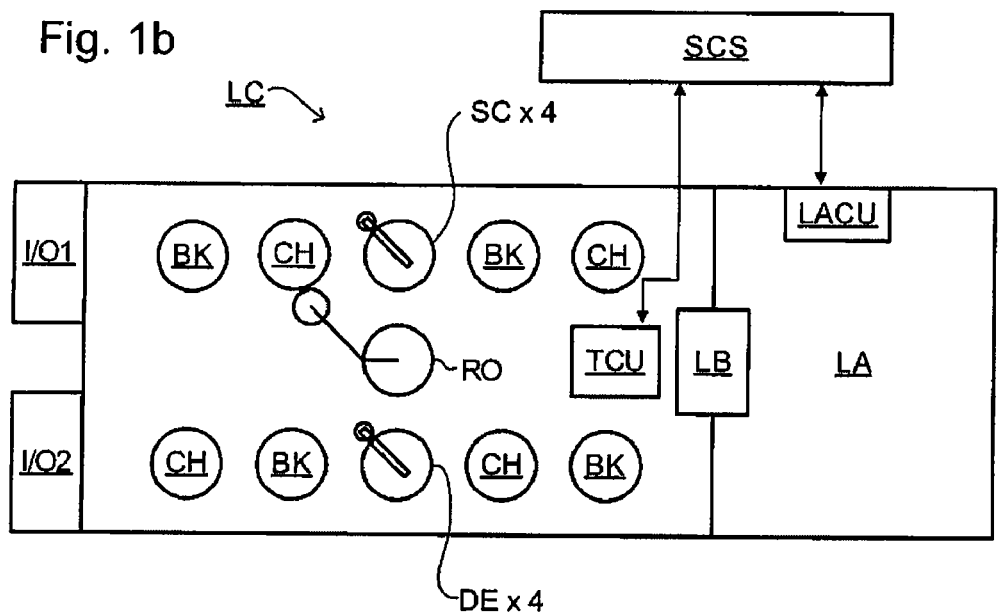
FIG. 1b depicts a lithographic cell or cluster in accordance with an embodiment of the invention.

As shown in FIG. 1b, the lithographic apparatus LA forms part of a lithographic cell LC, also sometimes referred to a lithocell or cluster, which also includes apparatus to perform pre- and post-exposure processes on a substrate. Conventionally, these include spin coaters SC to deposit resist layers, developers DE to develop exposed resist, chill plates CH, and bake plates BK. A substrate handler, or robot, RO picks up substrates from input/output ports I/O1 and I/O2 and moves them between the different process apparatus and delivers them to the loading bay LB of the lithographic apparatus. These devices, which are often collectively referred to as the track, are under the control of a track control unit TCU, which is controlled by a supervisory control system SCS, which also controls the lithographic apparatus via a lithography control unit LACU. Thus, the different apparatus can be operated to maximize throughput and processing efficiency.

In order to ensure that the substrates exposed by the lithographic apparatus are exposed correctly and consistently, it is desirable to inspect the exposed substrates to measure properties such as overlay errors between subsequent layers, line thicknesses, critical dimensions (CD), etc. If errors are detected, adjustments may be made to exposures of subsequent substrates, especially if the inspection can be performed while other substrates of the same batch are yet to be exposed. Also, already exposed substrates may be stripped and reworked (to improve yield) or discarded, thereby avoiding performing exposures on substrates that are known to be faulty. In a case where only some target portions of a substrate are faulty, further exposures can be performed only on those target portions which considered are good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable rapid measurements, it is desirable that the inspection apparatus measure properties in the exposed resist layer immediately after the exposure. However, the latent image in the resist has very low contrast (there is only a very small difference in refractive index between the parts of the resist which have been exposed to radiation and those which have not) and not all inspection apparatus have sufficient sensitivity to make useful measurements of the latent image. Therefore, measurements may be taken after the post-exposure bake step (PEB), which is customarily the first step performed on exposed substrates and increases the contrast between exposed and unexposed parts of the resist. At this stage, the image in the resist may be referred to as semi-latent. It is also possible to make measurements of the developed resist image (at which point either the exposed or unexposed parts of the resist have been removed) or after a pattern transfer step such as etching. The latter possibility limits the possibilities for rework of faulty substrates but may still provide useful information.

Figure 2:
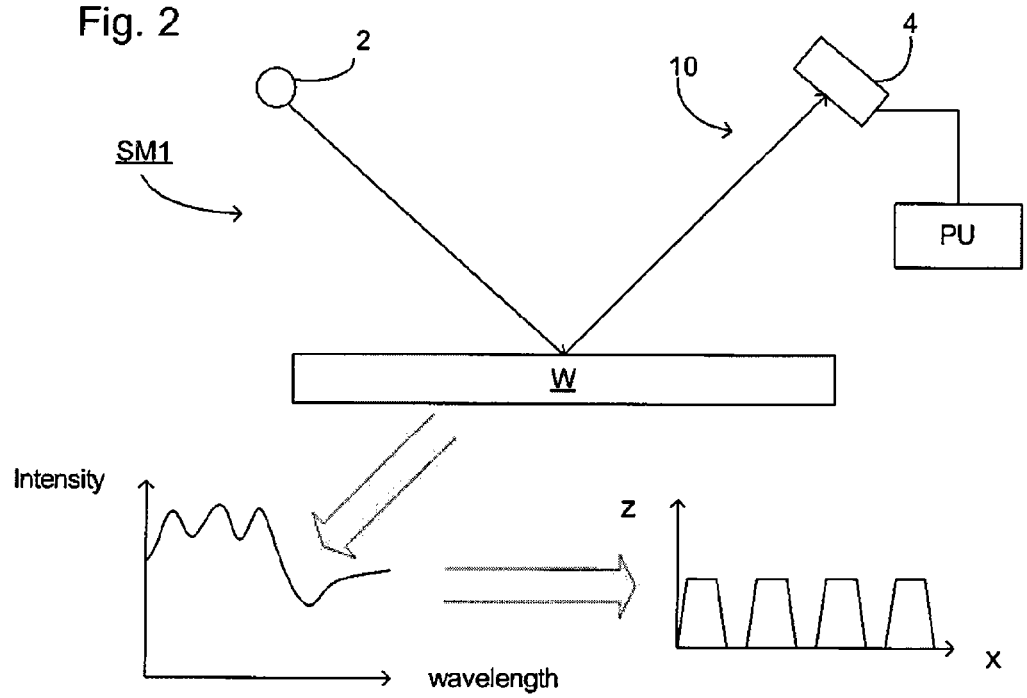
FIG. 2 depicts a first scatterometer in accordance with an embodiment of the invention.

FIG. 2 depicts a scatterometer SM1 that may be used in an embodiment of the present invention. It includes a broadband (white light) radiation projector 2 that projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU (e.g., by Rigorous Coupled Wave Analysis and non-linear regression or by comparison with a library of simulated spectra as shown at the bottom of FIG. 2). In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 3:
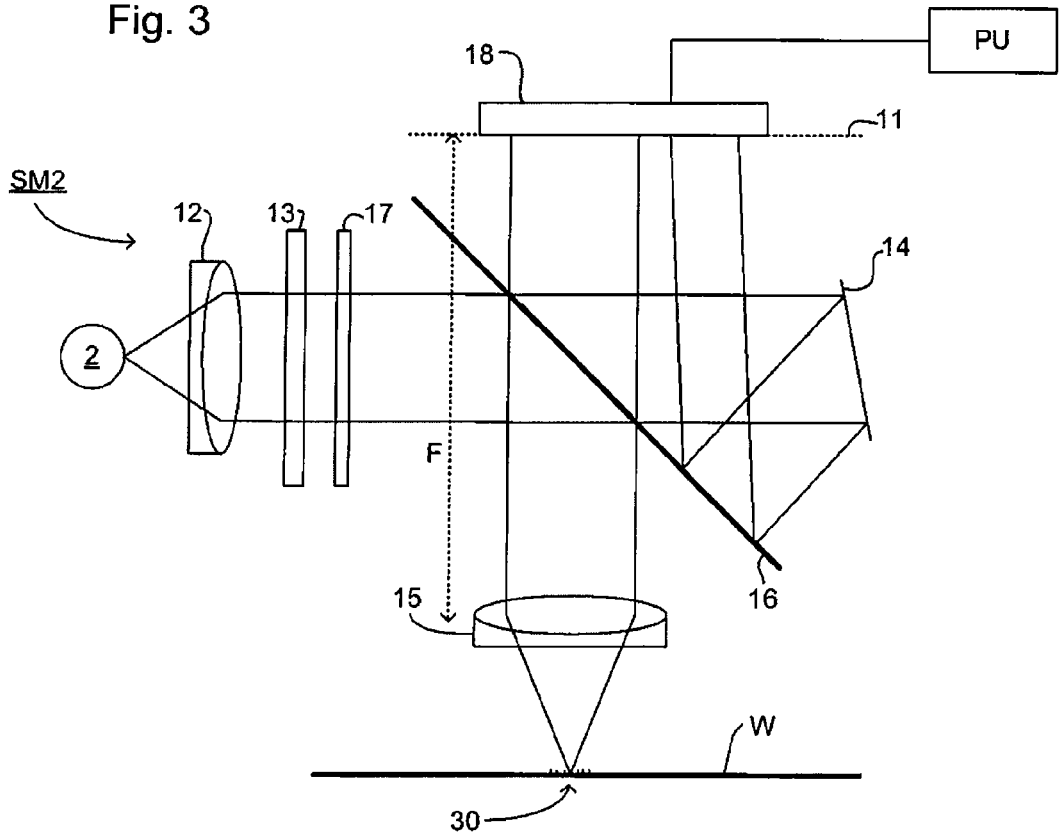
FIG. 3 depicts a second scatterometer in accordance with an embodiment of the invention.

Another scatterometer SM2 that may be used in an embodiment of the present invention is shown in FIG. 3. In this device, the radiation emitted by radiation source 2 is focused using lens system 12 through interference filter 13 and polarizer 17 and reflected by partially reflected surface 16 and is focused onto structure 30 on substrate W via a microscope objective lens 15, which has a high numerical aperture (NA) (e.g., at least 0.9 or at least 0.95). Immersion scatterometers may have lenses with numerical apertures over 1. The reflected radiation then transmits through partially reflective surface 16 into a detector 18 in order to have the scatter spectrum detected. The spectrum may be processed by the processing unit PU. The detector may be located in the back-projected pupil plane 11, which is at the focal length of the lens system 15; however, the pupil plane may also be re-imaged with auxiliary optics (not shown) onto the detector. The pupil plane is the plane in which the radial position of radiation defines the angle of incidence and the angular position defines azimuth angle of the radiation. The detector is preferably a two-dimensional detector so that a two-dimensional angular scatter spectrum of the substrate target can be measured. The detector 18 may be, for example, an array of CCD or CMOS sensors, and may use an integration time of, for example, 40 milliseconds per frame.

A reference beam is often used, for example, to measure the intensity of the incident radiation. To do this, when the radiation beam is incident on the beamsplitter 16, part of the beam is transmitted through the beamsplitter as a reference beam towards a reference mirror 14. The reference beam is then projected onto a different part of the same detector 18.

A set of interference filters 13 is available to select a wavelength of interest in the range. The range of interest may be, for example, about 405-790 nm or a lower range such as, for example, about 200-300 nm. The interference filter may be tunable rather than including a set of different filters. A grating could be used instead of interference filters.

The detector 18 may measure the intensity of scattered light at a single wavelength (or narrow wavelength range) and the intensity separately at multiple wavelengths or integrated over a wavelength range. Furthermore, the detector may separately measure the intensity of transverse magnetic- and transverse electric-polarized light and/or a phase difference between the transverse magnetic- and transverse electric-polarized light.

Using a broadband light source is possible (i.e., one with a wide range of light frequencies or wavelengths), which gives a large etendue, allowing a mixing of multiple wavelengths. Each wavelength in the broadband preferably each has a bandwidth of $\delta\lambda$ and a spacing of at least $2\delta\lambda$ (i.e., twice the wavelength). Several "sources" of radiation can be different portions of an extended radiation source which have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target on substrate W may be a grating, which is printed (for example, using the lithographic system described above) such that after development, the bars are formed of solid resist lines. The bars may alternatively be etched into the substrate. This pattern is sensitive to chromatic aberrations in the lithographic projection apparatus, particularly the projection system PL, and illumination symmetry and the presence of such aberrations can manifest themselves in a variation in the printed grating. Accordingly, the scatterometry data of the printed gratings is used to reconstruct the gratings (and thus determine whether there are errors in any part of the lithocell or in the alignment of the substrate with respect to the lithocell that manifest themselves as variations in the target). The parameters of the grating, such as line widths and shapes, may be input to the reconstruction process, performed by processing unit PU, from knowledge of the printing step and/or other scatterometry processes.

Figure 4:
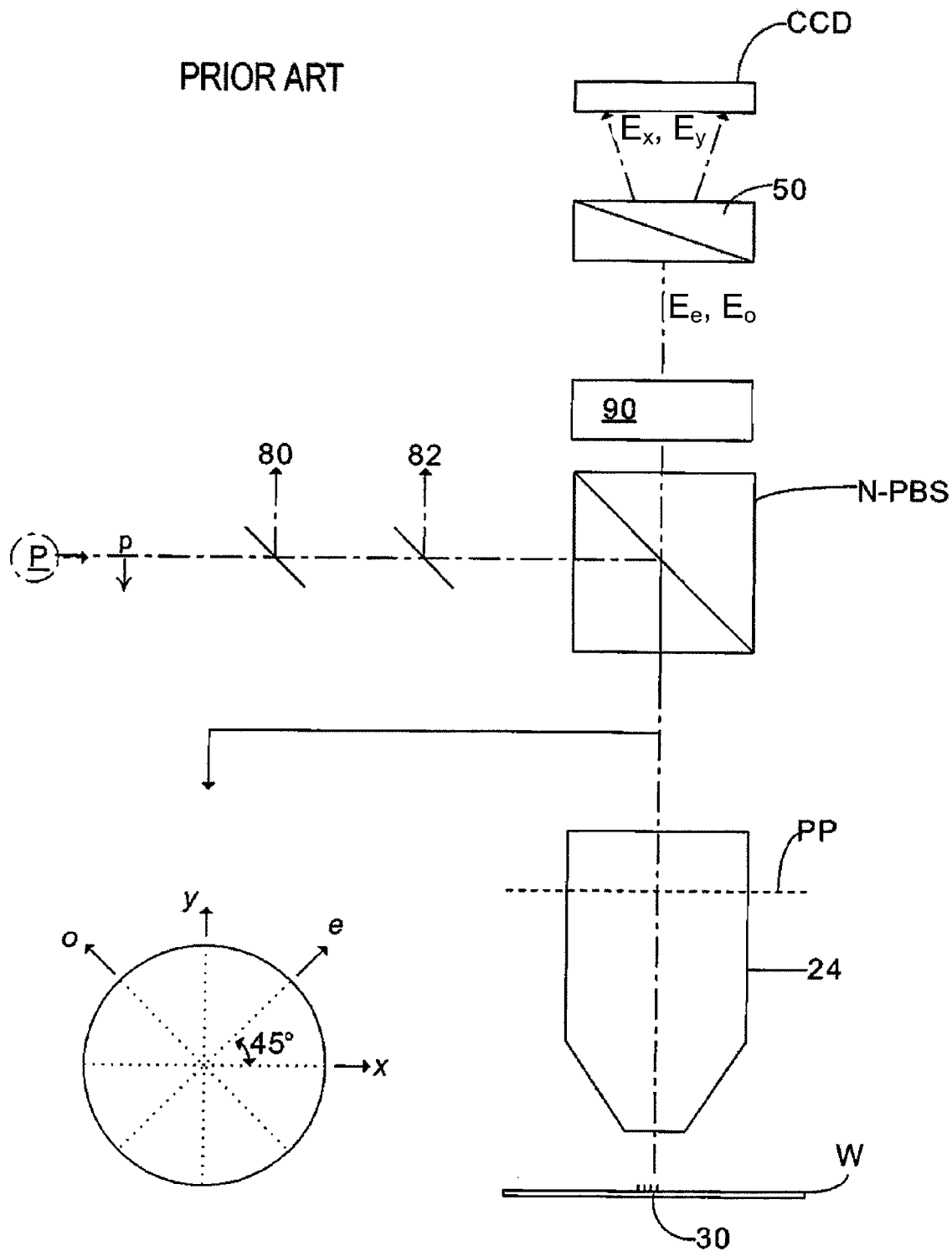
FIG. 4 depicts an inspection apparatus.

As discussed above, a development from a simple scatterometer is an ellipsometer, which may be used to determine the shapes and other properties of structures on a substrate using slightly different parameters of the reflected light. This can be done with an incident beam reflected from a substrate W, as shown in FIG. 4, where the incident beam reflects off the target structure 30. The reflected beam passes through a microscope objective 24, through a non-polarizing beamsplitter N-PBS, and through focusing lenses (or other optics) onto a camera CCD.

In the previously envisaged embodiment discussed above, the beam is split by a further beamsplitter 50 and directed onto the camera CCD. At this point, the beam is either a TM (transverse magnetic) polarized beam or a TE (transverse electric) polarized beam. The pupil plane PP of the microscope objective 24 is shown in FIG. 4. It is at this pupil plane PP that the microscope objective focuses the radiation that is reflected and scattered from the surface of the substrate W. The image that is created at this pupil plane PP is subsequently recreated on the camera CCD using lenses or other optics such that the acquired image contains the largest amount of information possible (i.e., because there is no loss of sharpness or scattering of radiation outside of the aperture of the camera CCD).

FIG. 4 also shows a phase modulator 90 positioned between the non-polarizing beamsplitter N-PBS and the beamsplitter 50 that separates the polarized beams prior to transmitting polarized beams to the camera CCD. An eo-coordinate system that is orientated along the extraordinary and ordinary axes of the phase modulator 90 is also shown in FIG. 4 as a circle and shows a relative position of the extraordinary and the ordinary axes compared to the x and y-axes of the system. $E_o$ and $E_e$ are the unknown complex amplitudes of the scattered fields along, respectively, the e and o directions. For the purposes of the present invention, only the real parts of the complex amplitudes dealing with reflectance R (hence $R_o$ and $R_e$ or $R_s$ and $R_p$) are dealt with. In this system, it is this reflectance, compared with the changed phase as predefined by the phase modulator, which enables the system to determine the parameters of the structure 30.

In order to remove the phase modulator 90, four differently polarized reflected sub-beams from a single incident beam may be obtained in order to measure, from a measured intensity of each sub-beam, the difference in amplitude ($\Delta$) and phase ($\Psi$) of the four known polarizations. The effect of the structure 30 on a radiation beam is different for each polarization direction and so measuring the properties of each sub-beam with a different polarization direction gives rise to a reconstruction of the structure 30. However, manipulating the radiation beam after it has been reflected from the surface of the substrate risks incorporating errors into the measurements.

In an embodiment of the present invention, on the other hand, the beam is not split into sub-beams using further devices. In an embodiment, the system does not have the problems of the phase-shifter (or modulator) described above. An embodiment of the present invention can be based on the apparatus shown in FIG. 4, but instead of using a phase-shifter 90, the phase shift (or retardation δ) is fixed. For a given wavelength, the phase shift can be unknown, but can be determined from data analysis of the complete pupil results as will be described further below.

Figure 5:
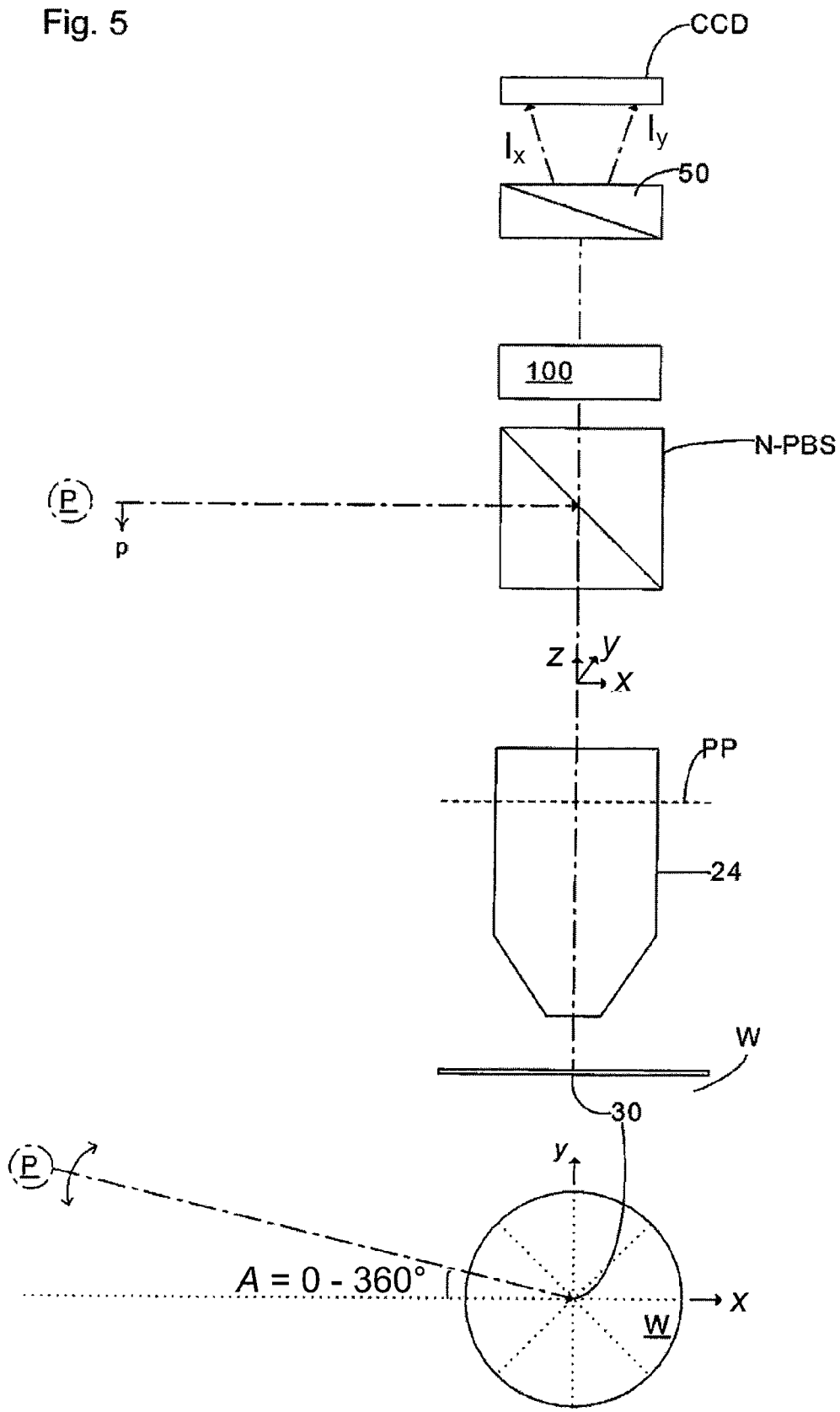
FIG. 5 depicts an inspection apparatus according to an embodiment of the present invention.

The apparatus in accordance with an embodiment of the present invention is depicted in FIG. 5. Light or radiation of a fixed wavelength from a source P with a known polarization state p is reflected from the target 30 on the surface of the substrate W to be investigated. For calibration purposes, the target 30 may be simply the plane surface of the substrate. The fixed-wavelength light or radiation reflects at multiple angles of incidence (e.g., $\theta_i$=0-80°) and at substantially all azimuth angles (e.g., A=0-360°). Ranges within these ranges (or even outside of the listed range for the angle of incidence) may also be selected for calibration and other purposes, depending on the processing capacity available. The reflected light or radiation beam (as the incident light beam) consists of a full available range of light rays with different polarization states. The reflected light or radiation is received by a microscope objective 24 and focused on the pupil plane PP, which is reproduced at camera CCD for the same reasons provided above with respect to FIG. 4.

As indicated above, ellipsometry compares the reflectance of the p-polarized component with the s-polarized component. When using linearly polarized light, on azimuth angles (A) of 0 and 90°, information from the other polarization angles will be missing such that an optimal ellipsometry can be found at azimuth angles of A=45 and 135°, which are at an angle to the polarized components and do not cancel out those components.

The radial position of the measured radiation beam is proportional to the angle of incidence of the incident beam. Its azimuth angle A is calculated from the positive x-axis as shown on the bottom of FIG. 5 and in FIG. 6, where the azimuth angle of the incident beam is labeled as Ai. During the calibration step, the radiation beam is detected and recorded at all angles of incidence and all azimuth angles and is reflected from a plane surface such that the polarization states of the beam should not be affected. Knowing what a light beam will look like depending on its angle of incidence and its azimuth angle enables a description of the light beam in polar coordinates, which is useful for measurements at the CCD camera of the reflected light beam. The "description" of the light beam may take the form of an image as shown in FIG. 9, where the center of the image shows the intensity of radiation that is reflected along a normal N (or z-axis z of FIG. 6) to the substrate, and the outer periphery of the image shows the intensity of the radiation that is reflected at a maximum angle from the normal N (e.g., 80°).

A basic set up of a scatterometer, such as that shown in FIG. 2 or FIG. 3, may be used. A microscope objective 24 receives a beam that is reflected from the structure 30 present on the substrate W. The incident beam may have passed through the microscope objective before reflecting off the structure 30, or it may have been focused using other means. In order to be able to measure a reflected beam for all azimuth as well as incident angles, the incident beam has circular (or elliptical) polarization rather than linear polarization, enabling all directions of polarization to be measured and reducing the risk of loss of some of the beam during reflection. The risk of loss is reduced because even if information from one polarization state is lost, several polarization states remain to be measured.

The incident light for each measurement has a fixed wavelength and a known polarization state. The same wavelength and polarization state is investigated at multiple angles of incidence (e.g., 0-80°) and at substantially all azimuth angles (e.g., 0-360°) as described above. The returning or reflected light beam consists of an effectively infinite number of rays with different polarization states.

FIG. 5 shows a combined light or radiation beam that is elliptically polarized and enters a non-polarizing beamsplitter N-PBS where about 50% of the light or radiation will be transmitted and 50% will be reflected (though beamsplitters can be manufactured and used herein to transmit and reflect various percentages of incident radiation). The ellipsometric data of the transmitted beam are measured by separating the energy of the x- and y-polarized components $I_x$ and $I_y$ of the transmitted beam with the help of a polarizing beamsplitter 50 (e.g., a Wollaston prism). This gives rise to the orthogonally polarized sub-beams. The relative phase of the sub-beams with different polarization states needs to be changed in order to be compared to give a full picture of the state of the beam reflected from the structure (e.g., to measure by how much the relative phase difference changes or so that the recombined sub-beams create circularly or elliptically polarized light, which gives rise to the useful images created by the camera).

Figure 7:
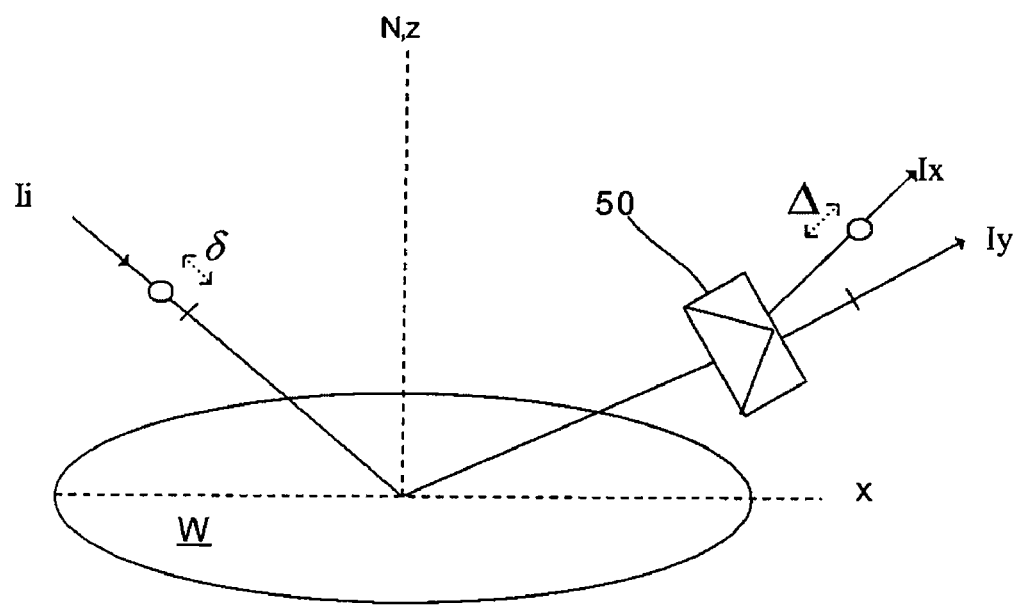
FIG. 7 depicts a behavior of polarization states of a radiation beam.

However, rather than using a variable phase-shifter 90 (such as the device used in FIG. 4) there is no variable or adjustable phase shift. Rather, the phase-shift or retardation δ between the e and o amplitudes may be fixed as shown in FIG. 7. Specifically, FIG. 7 shows a first polarization direction as a circle and a second polarization direction as a line across the beam direction. The retardation δ is shown as the distance between these two representative symbols. The retardation δ is preferably in the region of 90° or 270°. This retardation may be generated, for instance, by a quarter wave plate. If the retardation is not exactly known, this may be derived from results of the off-diagonal or full pupil information as will be discussed below with reference to FIGS. 9-12.

Figure 6:
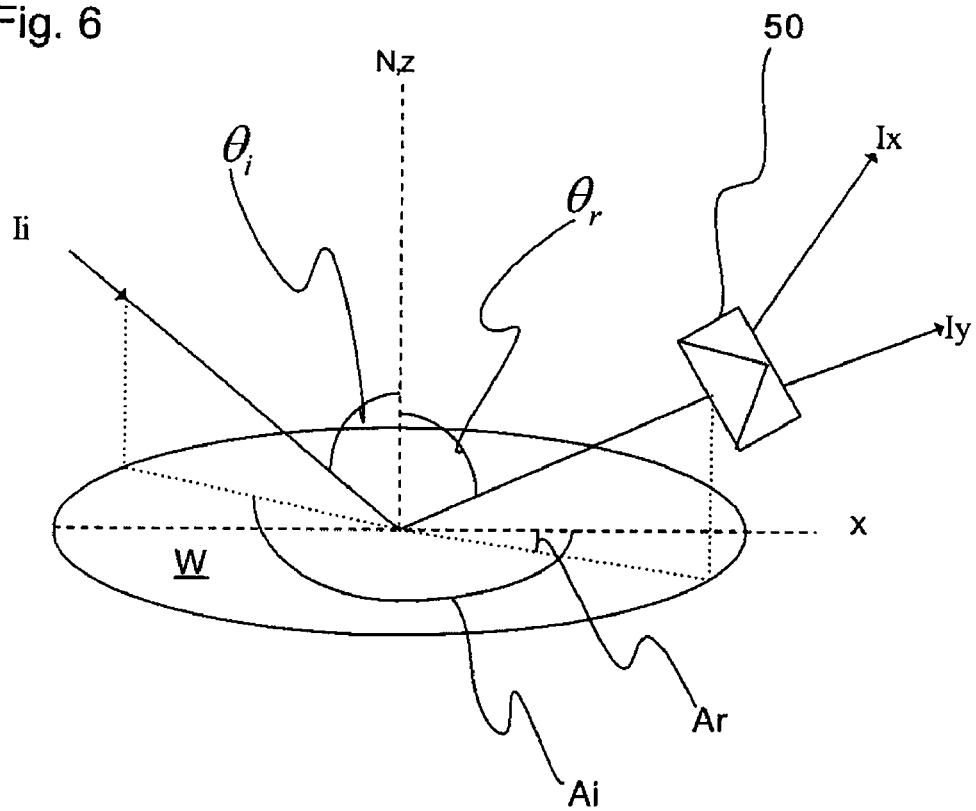
FIG. 6 depicts a behavior of a radiation beam according to an embodiment of the present invention.

FIG. 6 shows an incident beam with an intensity $I_i$, at an incident angle $\theta_i$; from the normal N or z-axis z and an azimuth angle $A_i$ from the x-axis. The incident beam reflects from the surface of the substrate W and is sent in a new direction as a reflected beam at a reflectance angle $\theta_r$ from the normal N and azimuth angle $A_r$ from the x-axis. The reflected beam is split by beamsplitter 50 into two sub-beams with intensities $I_x$ and $I_y$. The beamsplitter provides two sub-beams that have different polarization states, as can be seen in FIG. 7. An imposed retardation or phase shift δ between two polarization states in the incident beam becomes a phase difference Δ between complex amplitudes of the reflected and split sub-beams.

The elliptically polarized beam may be reconstructed at the camera by combining the two intensities, $I_x$ and $I_y$, which are the two measured intensities of beams with a fixed relative phase-shift δ caused by the fixed phase-shifter 100 and which represent the intensities of the two differently polarized beams.

The average intensity, m, is given by the following formula:

$$m = I_x + I_y \quad (3),$$

wherein difference d between the intensities is defined as follows:

$$d = I_y - I_x \quad (4)$$

For surfaces without grating structures, the reflectance for p ($R_p$) and s ($R_s$) are essentially independent of the azimuth angle A, which holds for most blank surfaces that are used for calibration purposes. This means that reflectance coefficients of the two polarized sub-beams $R_p$ and $R_s$ (and combinations thereof) are not functions of A. Intensity I, on the other hand, is dependent on A, as well as on reflectance R.

The average intensity m is not dependant on retardation (δ) because the two intensities of the polarized sub-beams are merely added together and a single resultant intensity can be easily measured at the detector:

$$m = I_x + I_y = Rp^2(C_4 + C_2S_2) + Rs^2(S_4 + C_2S_2)$$

so $$m = 0.5(Rp^2 + Rs^2) + 0.5C(2A)(Rp^2 - Rs^2) \quad (5),$$

wherein $$C_4 = \cos(A)^4$$

$$S_4 = \sin(A)^4$$

$$C_2S_2 = \cos(A)^2 \sin(A)^2$$

$$C_3S = \cos(A)^3 \sin(A)$$

$$CS_3 = \cos(A)\sin(A)^3$$

$$C(2A) = \cos(2A) \quad (6)$$

Knowing azimuth angle A of the incident beam and m from detector measurement, tan P can be derived using the following into equation (5):

$$\tan\psi = \frac{Rp}{Rs} \text{ or } \psi = \arctan\left(\frac{Rp}{Rs}\right) \quad (7), (8)$$

On the other hand, when considering the difference between the intensities, as there is a phase difference between the two sub-beams with different polarization states, determining the difference between the intensities of the two states takes that phase difference into account. Furthermore, the difference in intensity between the two sub-beams is dependent both on the applied phase-shift or retardation δ and on the resultant phase difference after reflection Δ. The difference between the intensities is therefore given as follows:

$$d = I_y - I_x = \{Rp^2(C_4 - C_2S_2) + Rs^2(S_4 - C_2S_2)\}\cos(\delta) + \ldots$$
$$RpRs\{\cos(\Delta)\cos(\delta)4C_2S_2 + \sin(\Delta)\sin(\delta)2(C_3S + CS_3)\} \quad (9)$$

Cos Δ (phase difference between the polarization states) is easily obtained when δ is known or estimated as will be discussed later with respect to FIGS. 9-12 and when Rp and Rs are determined from equations (5) and (8) above.

Whether during calibration or reconstruction of a structure on the substrate W, the elliptically polarized beam is reconstructed for known values of $I_x$ and $I_y$. Applying the relationship of the intensity of the elliptically polarized beam to the amplitude of the individual components (as shown in FIG. 8) gives the amplitudes that can be input into equations (1) and (2) above. The reconstructed beam thereby gives the phase difference (Δ) and relative amplitude alignment (tan ψ), thus giving rise to the parameters of the structure 30. In other words, the desired parameters, Δ and ψ, may be determined by measuring the average of the two received intensities at each pixel and the difference between the two intensities for each pixel that is measured on the CCD camera of FIG. 5, as long as the retardation δ is fixed and known (or estimated as described below).

FIGS. 9-12 depict ellipsometric data as received by the camera CCD of FIG. 5. The numbers on the axes of FIGS.

9-12 are pixel numbers from the CCD camera and the image is the same as that at the pupil plane of the microscope objective that picks up the reflected and scattered radiation from the surface of the substrate. The center point of each figure is the center of the pupil plane, representing radiation traveling on the normal. The edge of the "lot" or substrate W is imaged at the edge of the pupil plane and the pixels on this part of the image show radiation that has reflected at a maximum angle (e.g., 80° to the normal).

Specifically, FIG. 9 shows the average intensity m over the range of reflection angle of the radiation beam that impinges on the camera CCD for each pixel. In the example shown in FIG. 9, 550 nm wavelength radiation has been used.

Figure 10:
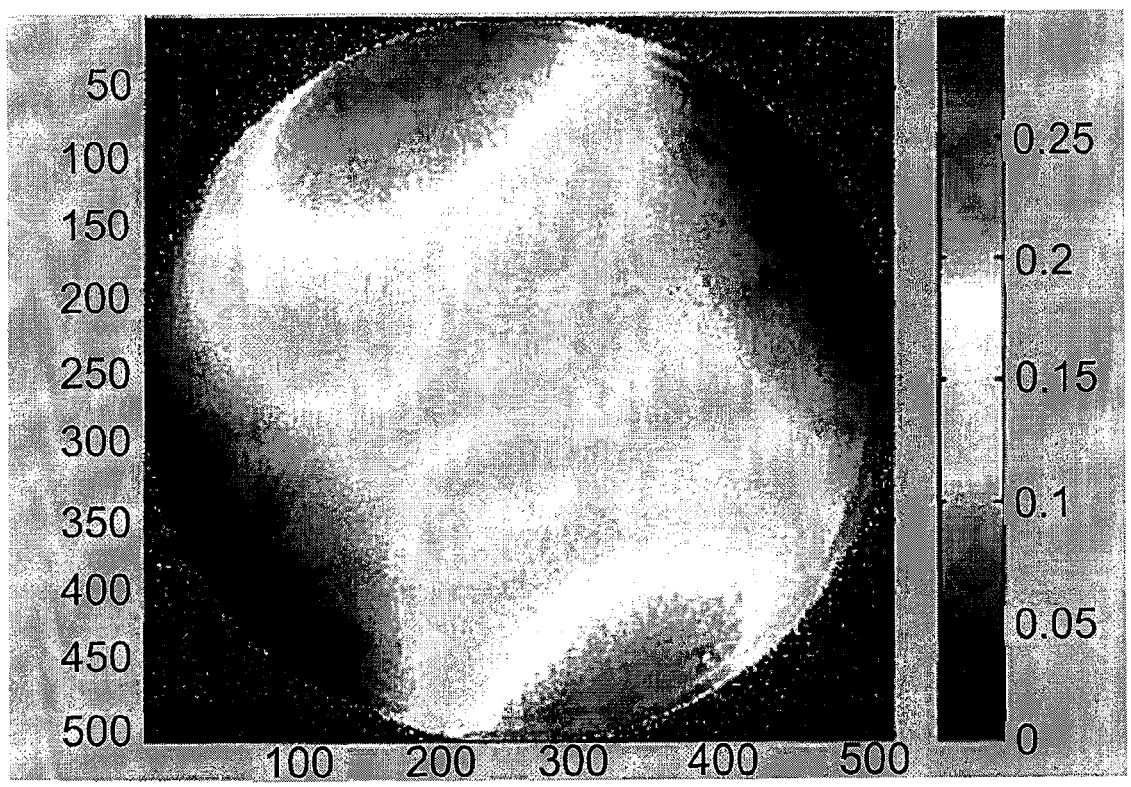

FIG. 10 shows the difference between the intensities, d, over the same area of the reflected and scattered radiation beam and also for each pixel. The evaluation of $\psi$ and $\Delta$ from the average intensity m and the difference in intensity d as shown in FIGS. 9 and 10, respectively, is carried out using the equations (5) and (9) listed above.

With respect to equation (9), an iterative process (which may be carried out by an optimization algorithm) is carried out to determine the value for $\delta$ in order to subsequently determine a value for $\Delta$. First, a value for $\delta$ is estimated. A good estimation is 1.5 radians (or approximately B/2 radians or. 90°) when a quarter wave plate is used. This is because a quarter wave plate delays one polarization direction by a quarter of a wavelength, effectively turning the polarization of the total beam by B/2 radians (and turning linearly polarized light into circularly polarized light). The phase shift $\delta$ is therefore likely to be in the region of 1.5 radians.

This estimation for $\delta$ is input into the first part of equation (9) above. The value of d is thereby calculated for each pixel. These values of d are shown in FIG. 10. If $\delta$ has been estimated correctly, the function $$d-[Rp^2(C_4-CS_2)+Rs^2(S_4-CS_2)*\cos(\delta)] \qquad (10)$$

should be symmetrical around the diagonals and should have no components with axial symmetry. If this is not the case, the estimate for $\delta$ is varied iteratively until the x- and y-axis values of d show only diagonal symmetry.

Figure 11:
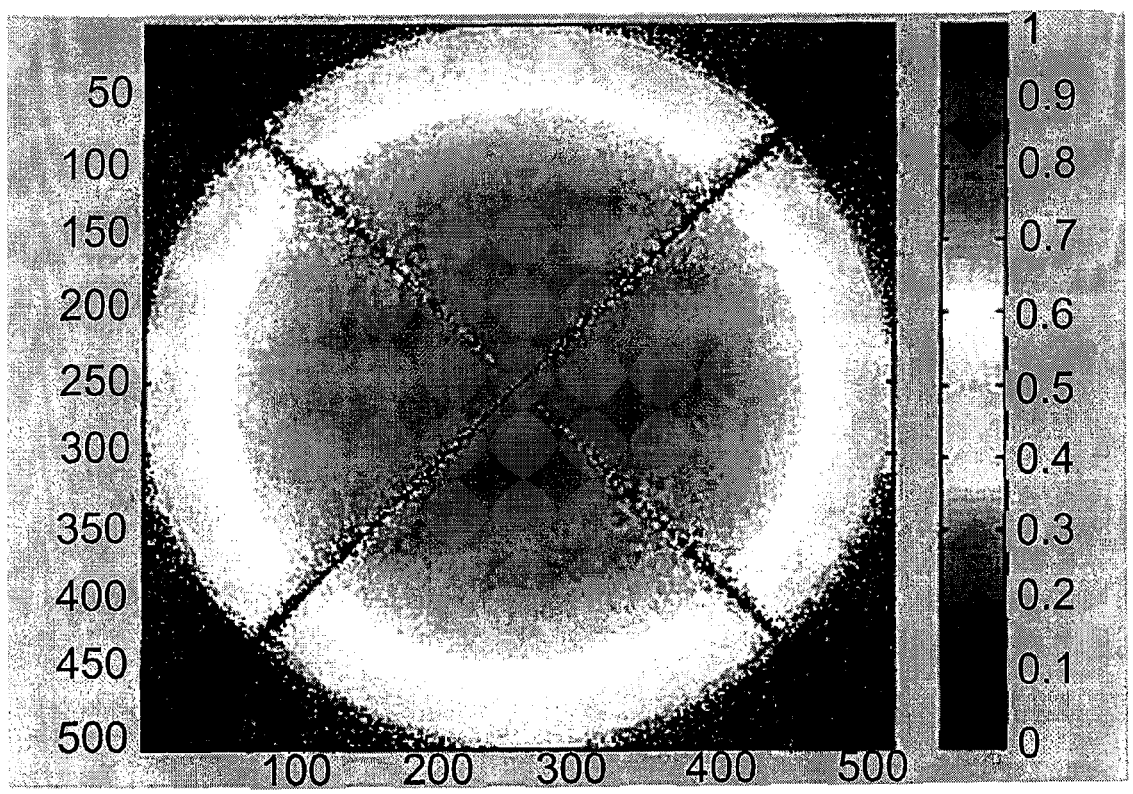

FIG. 11 shows the pixel values for $\psi$, derived using the knowledge of the value of m from its detection at the camera and its insertion into equation (5). Assuming a retardation $\delta$ of 1.50 radians, the image of $\psi$ is shown in FIG. 11.

Figure 12:
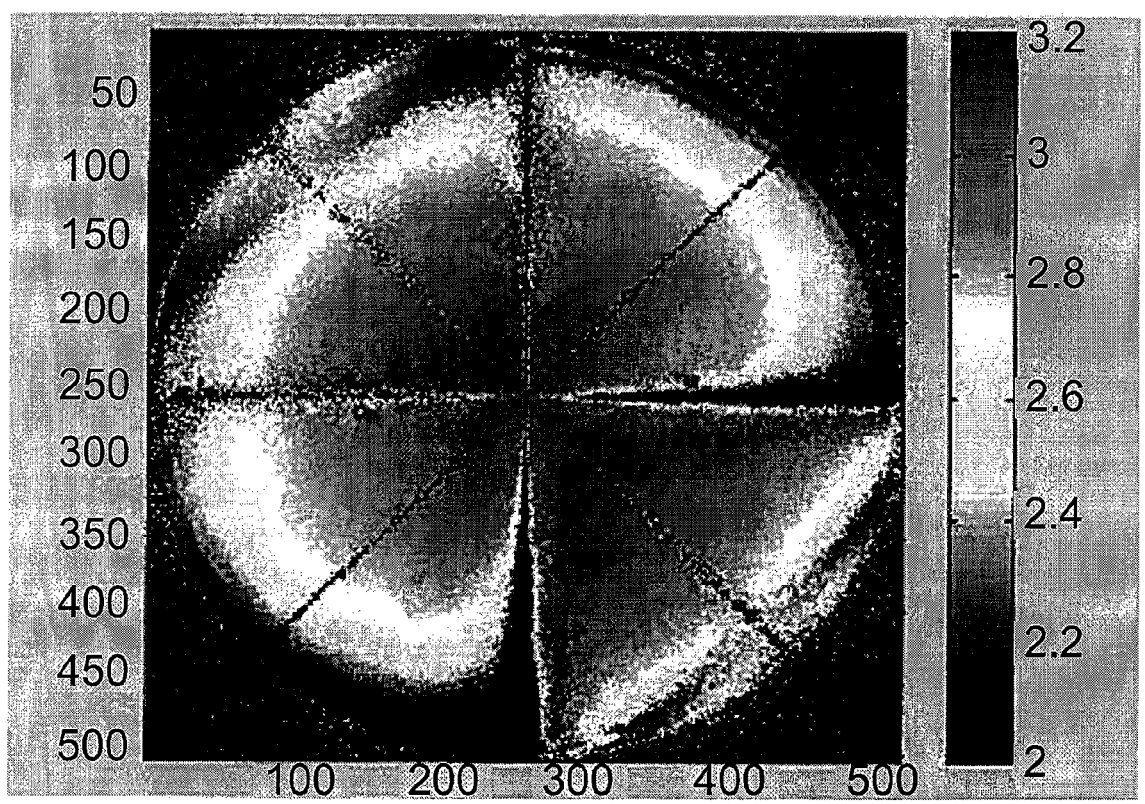

The pixel values of $\Delta$ is shown in FIG. 12, with the values of d from FIG. 10 and of $\delta$ as determined from equation (9). FIGS. 11 and 12 depict a variation in both $\psi$ and $\Delta$ that may be measured and interpreted to derive the shape of the surface from which the radiation beam has been deflected. Asymmetry in the images as well as the variation in shade from the outside to the center of the image give rise to measurable variation in parameters that may be used to reconstruct the radiation beam as it was received by the detector and thereby to determine the effect that the substrate surface had on the radiation beam. The effect of the surface on the radiation beam is directly linked to the shape of any object on the surface and so this can be derived.

The variation in $\psi$ and $\Delta$ may therefore be determined from the ellipsometric data as shown in FIGS. 11 and 12. Among the benefits of the described apparatus and method is that intensities may be measured simultaneously so that no measurement time is lost and the measurement is indeed as quick as a basic scatterometer, but with the benefit of having the separate measurements of the separate polarization states. This enables the use of a pulsed light source such as a laser. Furthermore, the phase-shifter may be a simple quarter wave plate with about 90° retardation. This means that less hardware needs to be added to an existing scatterometer in order to be able to allow much greater depth of analysis. Specifically, the described ellipsometer allows full-pupil analysis of measurements, not only on the azimuth angles A=45° and A=135° diagonals. This full-pupil approach has not previously been possible because all of the angles of reflectance have not previously been usable as they are in equations (5) and (9) above. In the case of unknown retardation by the phase shifter, retardation $\delta$ may be obtained from off-diagonal information on symmetry along the x/y axis or symmetry along 45/135° diagonals as described above. This determination of retardation $\delta$ is quickly obtainable using an optimization algorithm and values for P and $\Delta$ follow promptly.

Another benefit of using a fixed retardation ellipsometer as described above is that irregularities in an objective lens may be easily compensated as described below.

As discussed above, ellipsometry differs from scatterometry or reflectometry in that it does not only measure reflected light intensity of both p- and s-polarization states, but also the relative phase difference between the reflection amplitudes (or reflectance coefficients) of both the p- and s-polarization states (Rp and Rs). Specifically, ellipsometry uses the relative phase differences of the p-polarization state with respect to the s-polarization state to reconstruct the elliptically polarized light.

The uniqueness of an ellipsometer as described above is that reflectance may be measured for all angles of incidence and also for all azimuth angles.

In conventional scatterometry, as in ellipsometry, a circular pupil image is recorded on a CCD camera where, in polar coordinates, the angle (e.g., in radians from a central axis of symmetry) equals the azimuth angle of the grating being imaged and where the radius of the image equals the angle of incidence of the light onto that structure (i.e., the grating). A problem with conventional scatterometry, however, is that recorded reflected intensities as a function of incidence angle and azimuth angle are degraded by cleanliness of the lens system because only direct measurements of reflected intensity are used to create the image.

Previously, there had only been a temporary solution which had been to first obtain an intensity image from an approximately 100% reflecting aluminum mirror (i.e., a perfect mirror) to obtain a mirror reflection map. The second step was then to make a similar image from a grating or equivalent structure and normalize this image point by point with respect to the mirror reflection map. The normalization of one image with respect to the other gives rise to any differences that may be put down to dirt on the lens and may therefore be mathematically eliminated. This is a calibration step that may not be very robust because of the difficulty in maintaining a perfect mirror.

In scatterometry, the sensitivity to dust of $\psi$ may be largely eliminated using a calibration with a perfect mirror but that of $\Delta$ may not. However, with ellipsometry as described above, $I_y-I_x$ is not affected by dust particles on the optical elements thanks to the fact that $I_y-I_x$ is dependent on the phase difference between two polarization states, which is not affected by dust in the same way that an absolute value like reflectance is.

Figure 13:
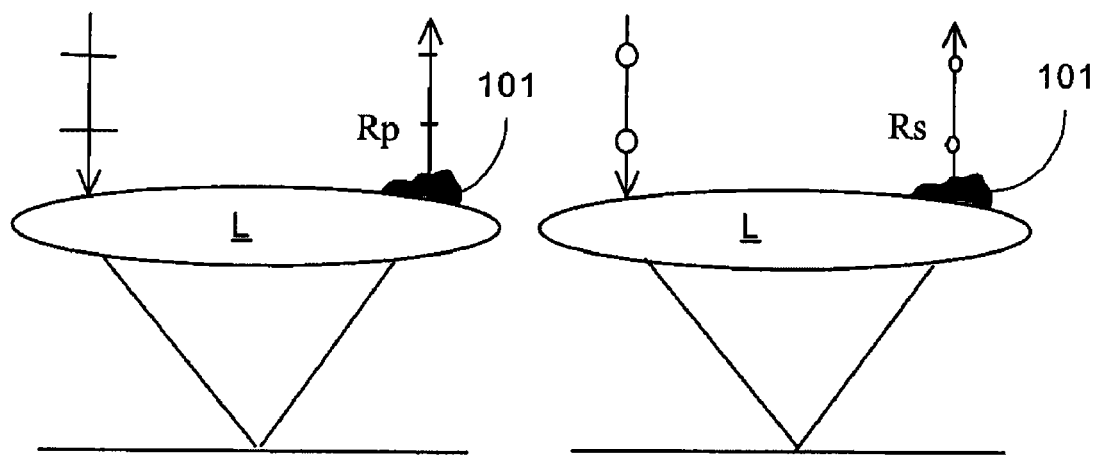
FIGS. 13 and 14 depict an effect of dirt on a lens through which polarized light is refracted.
Figure 14:
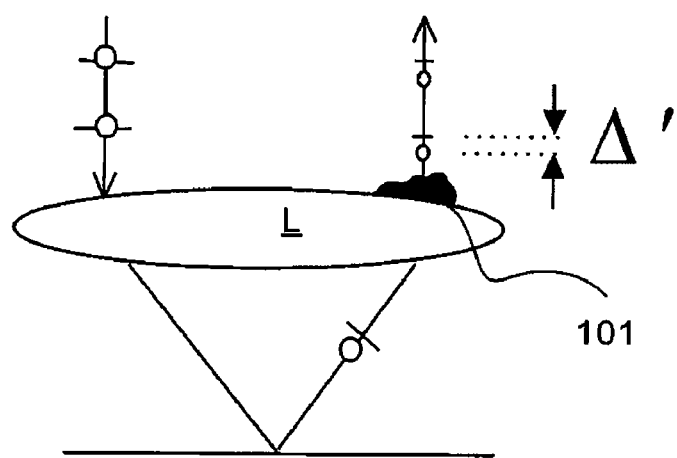

This benefit is demonstrated in FIGS. 13 and 14. FIG. 13 shows the classic scatterometry procedure, wherein polarized light is shone through a lens L upon which there is a particle of dirt or dust 101. In conventional scatterometry, the calibration step is used to determine what the effect of the dirt particle 101 has on each of the reflected beams Rp and Rs of the s-polarized and p-polarized states. However, in ellipsometry as shown in FIG. 14, especially in the phase measurement, the calibration steps can be omitted. The use of elliptically polarized light that has a known phase shift is used in ellipsometry. With the elliptically polarized light, dust or dirt particles 101 that may cause up to 10% shift in reflectivity will cause only a very small extra phase shift Δ' between the p- and s-polarization states. Furthermore, the shift will be the same for the reflected p-polarized rays as for the reflected s-polarized rays. Because, in ellipsometry, the phase difference is used for Δ, this tiny influence by the dust particle is cancelled out.

This effect has been confirmed by experiments. On a traditional phase-stepping ellipsometer built into a scatterometer for substantially all azimuth and incident angles, measurements of Δ and ψ have been made with and without correction with the mirror corrections maps (using the aluminum mirror as discussed above). Measurements have been made on pure silicon, silicon with 2000 nm of oxide and an aluminum mirror with 100 nm oxide. It has been shown in the experiments that no influence is observed in the ellipsometrically calculated Δ.

On another type of ellipsometer, such as that described above, similar but notably smaller differences have been observed have been carried out in the ellipsometrically realized Δ.

Figure 15:
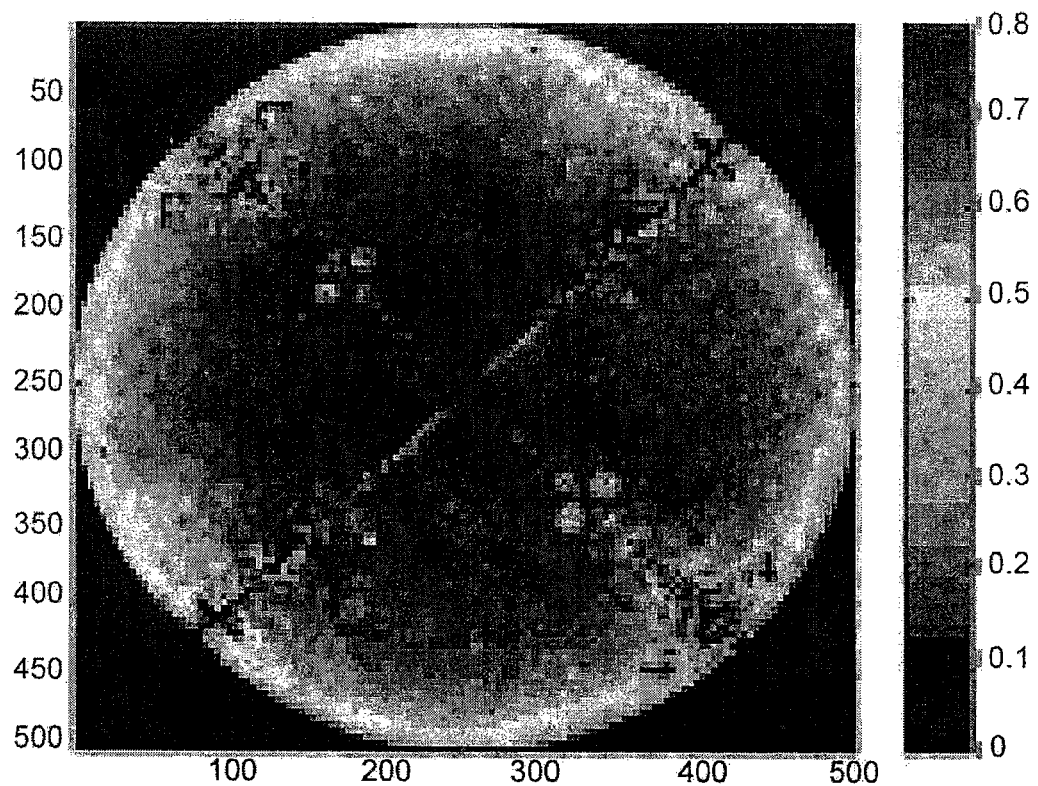
FIGS. 15 and 16 depict uncorrected ellipsometric measurements.
Figure 16:
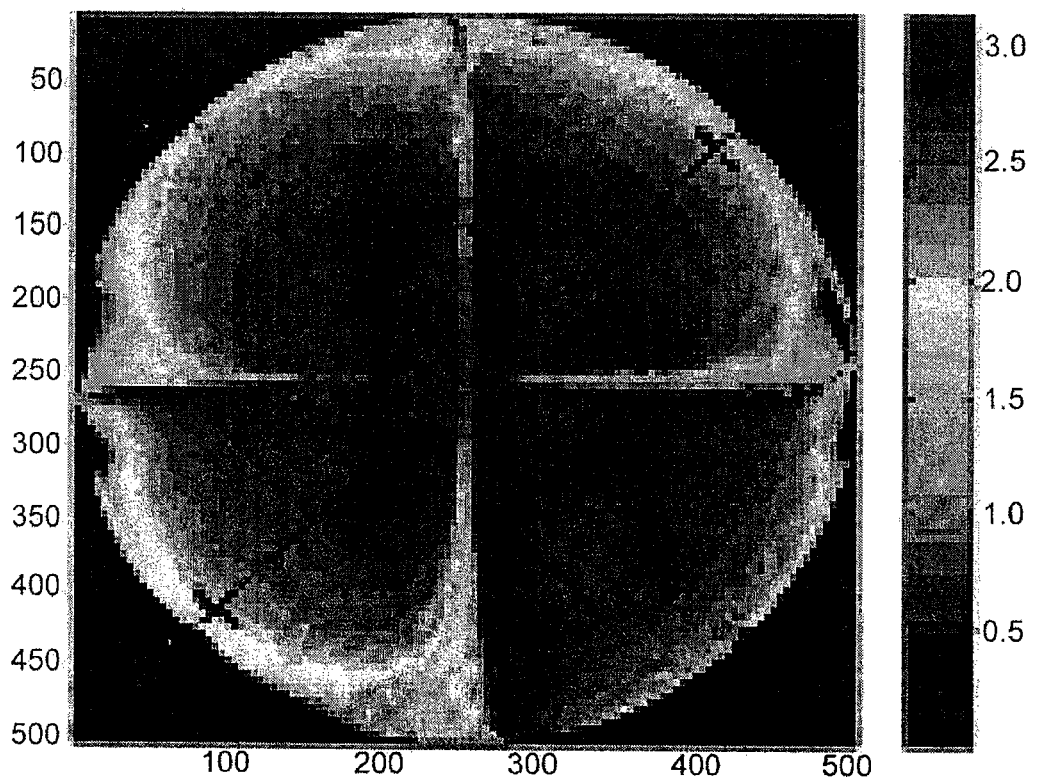
Figure 17:
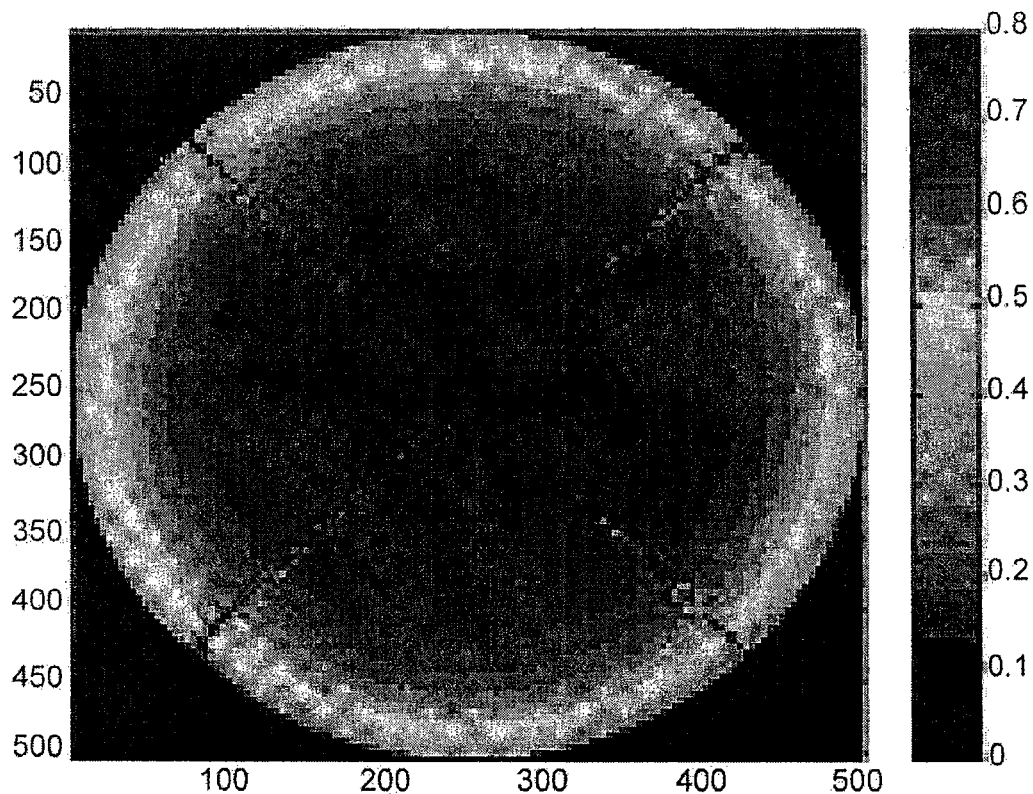
FIGS. 17 and 18 depict corrected ellipsometric measurements in view of FIGS. 15 and 16.
Figure 18:
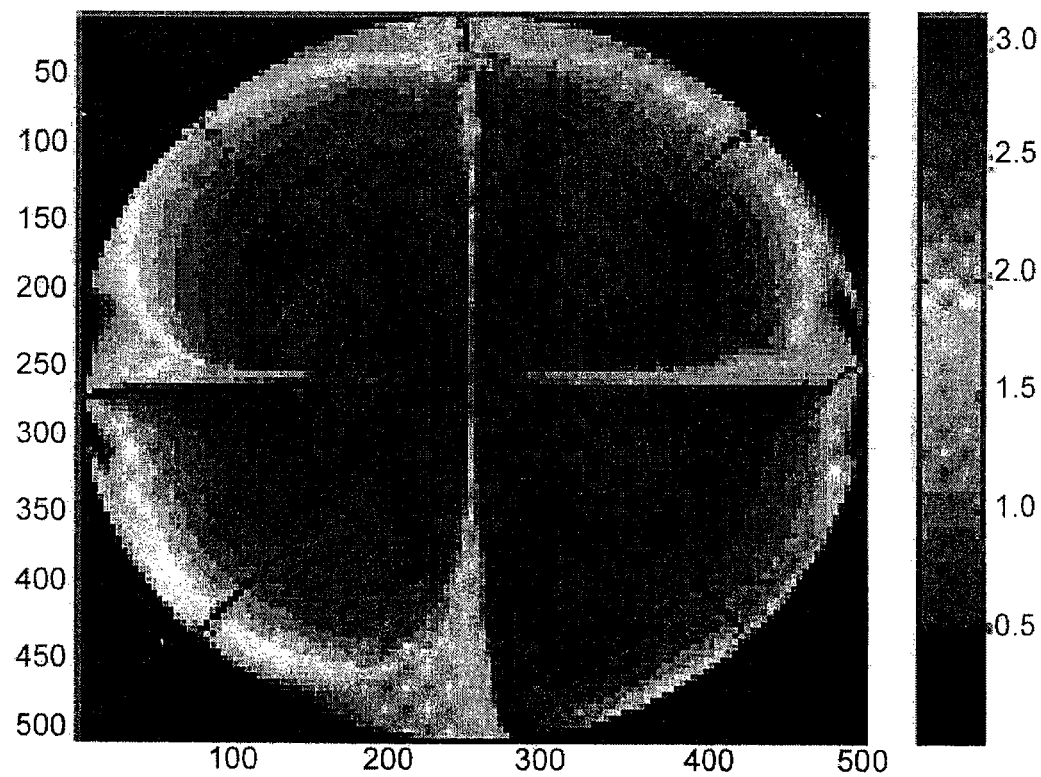

Complete pupil image plots of ψ and Δ on silicon at 550 nm wavelengths radiation are shown in FIGS. 15-18. FIG. 15 shows the uncorrected measurement of ψ. FIG. 16 gives the uncorrected measurement of Δ. On the other hand, FIG. 17 shows the corrected measurement of ψ in polar pupil coordinates and FIG. 18 gives the corrected measurement of Δ in polar pupil coordinates. As can be seen, there is very little difference between FIGS. 16 and 18 show that correction is not required due to the use of ellipsometric measurements.

Further experimental results are shown in FIGS. 19-24.

It has been found during experimentation that, from an image of the sum of intensities m (as a function of A, Rp, and Rs) and an image of the difference of intensities d (as a function of A, Rp, Rs, δ, and Δ), for a single known amount of introduced phase δ from the retarder 100, the ellipsometric value for Δ can be found.

The way this is done is from measurements on multilayered substrates where Fresnel equations can be used in the case of both the ellipsometric Δ and Ψ, and scatterometric Rp and Rs are independent of the azimuth angle A. From one single measurable function d and incorporating a known δ, the ellipsometric Δ can be found with formulae derived from equation (9) above:

$$d = p(A, Rp, Rs)*\cos(\delta) + \\ q(A, RpRs)*\cos(\delta)*\cos(\Delta) + r(A, RpRs)*\sin(\delta)*\sin(\Delta) \quad (11)$$

$$d = p(A, Rp, Rs)*\cos(\delta) + \\ q(A, RpRs)*\cos(\delta)*x + r(A, RpRs)*\sin(\delta)*\sqrt{1-x^2} \quad (12)$$

Comparing this to a phase stepper ellipsometer of the type described above that uses a variable phase shifter, a benefit lies in the relative simplicity of the mathematics, as a set of plots of d(δ) as recorded Fourier methods are not required when a fixed δ is used.

Among the benefits to using the present ellipsometer is to determine the fixed phase value δ as precisely as possible. Its value in the present invention may be found from the structure of the azimuthal dependence of function d. Specifically, the sub-function of d from equation (11), p(A, Rp, Rs) behaves differently from the sub-functions of d, q(A, Rp, Rs), and r(A, Rp, Rs) in the sense that function p is mirror-symmetric around the x- and y-axes and both functions q and r are mirror-symmetric around the diagonals. With this property, a straightforward separation of variables of equations (11) and (12) is possible, which gives rise to the determination of d. This is explained further below with respect to FIGS. 19-24.

The first step is to optimize the (unknown but alterable) value of δ such that d−p*cos(δ) only has symmetry left along the diagonals.

Figure 19:
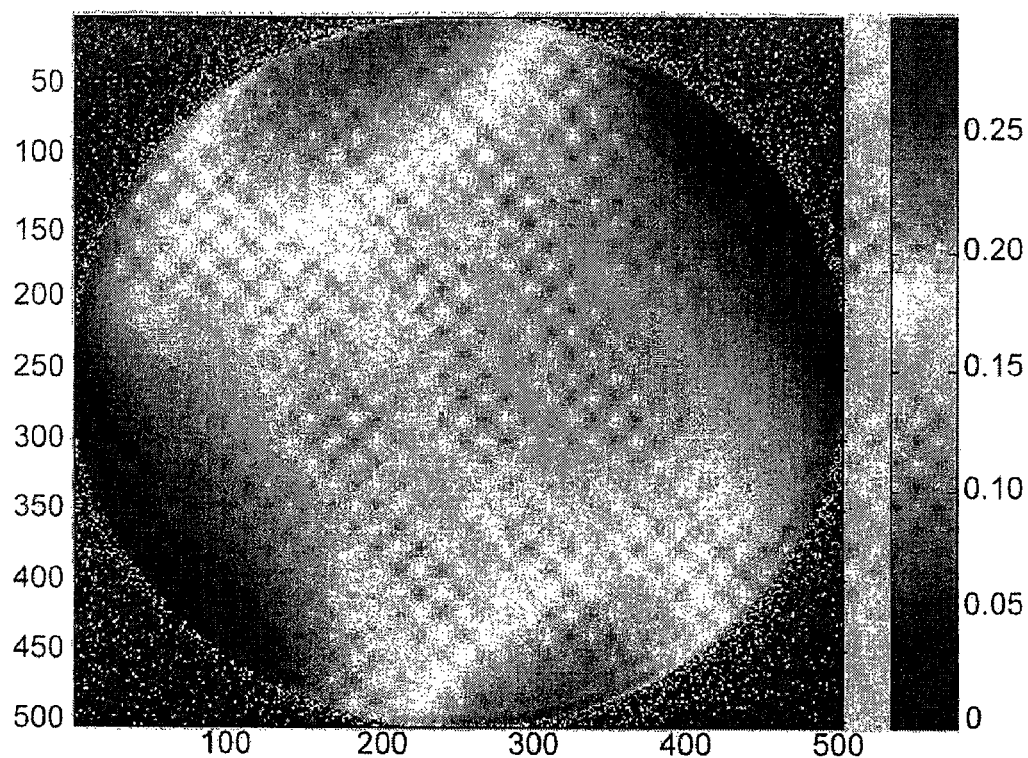
FIGS. 19-24 depict experimental measurements used to determine a phase shift (δ) between polarized reflected radiation sub-beams.
Figure 20:
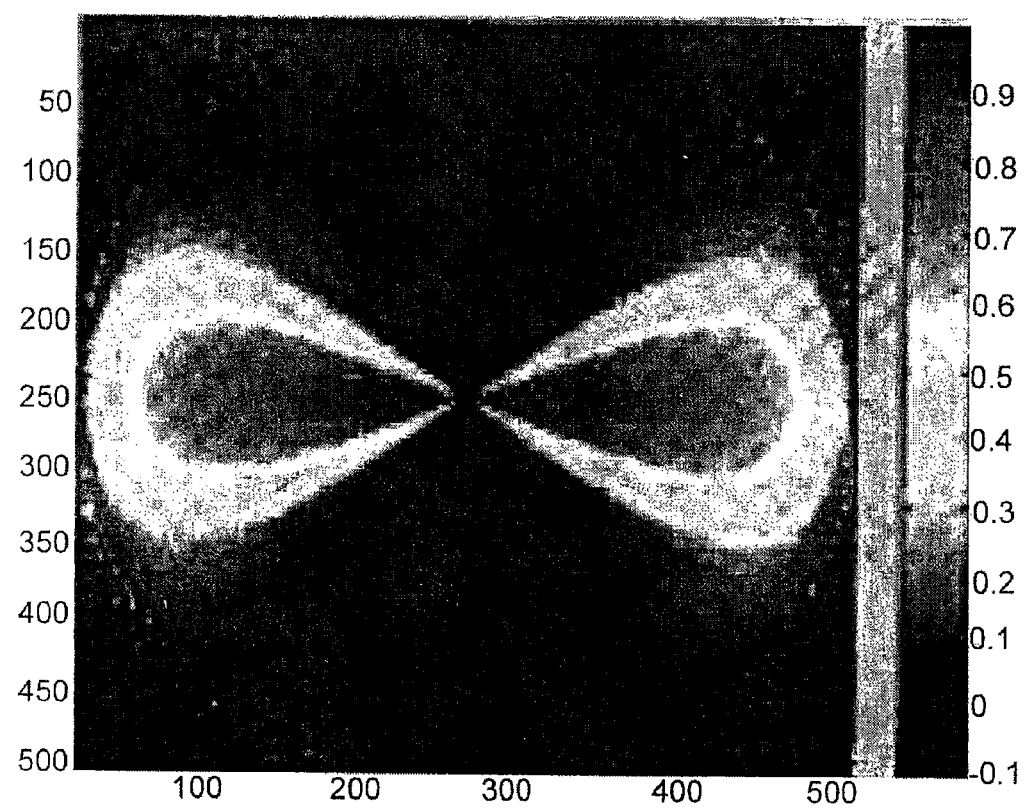
Figure 21:
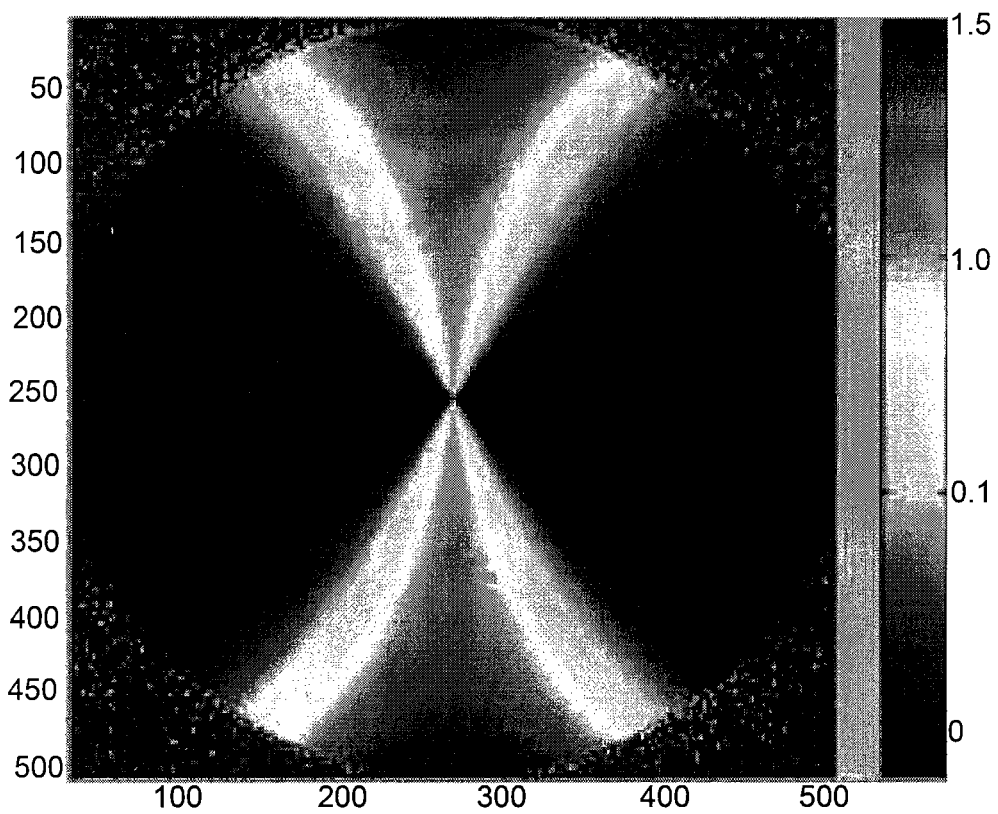
Figure 22:
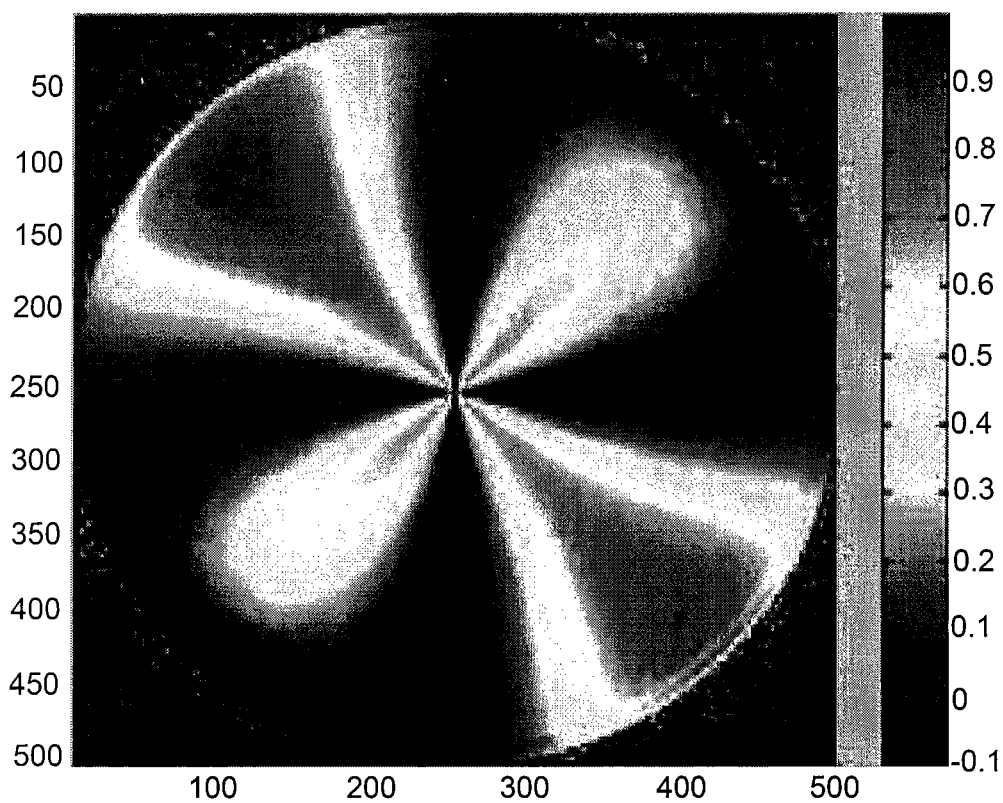

FIG. 19 shows a plot of function d for a still unknown fixed phase δ. FIGS. 20 and 21 show two components of function p(A, Rp, Rs). These components are subtracted from the measured function d. If δ is correctly chosen so that there is only symmetry along the diagonals and the subtraction (d−p*cos(δ)) is carried out, the result is an image that is only symmetrical around the diagonals, as shown in FIG. 22.

Figure 23:
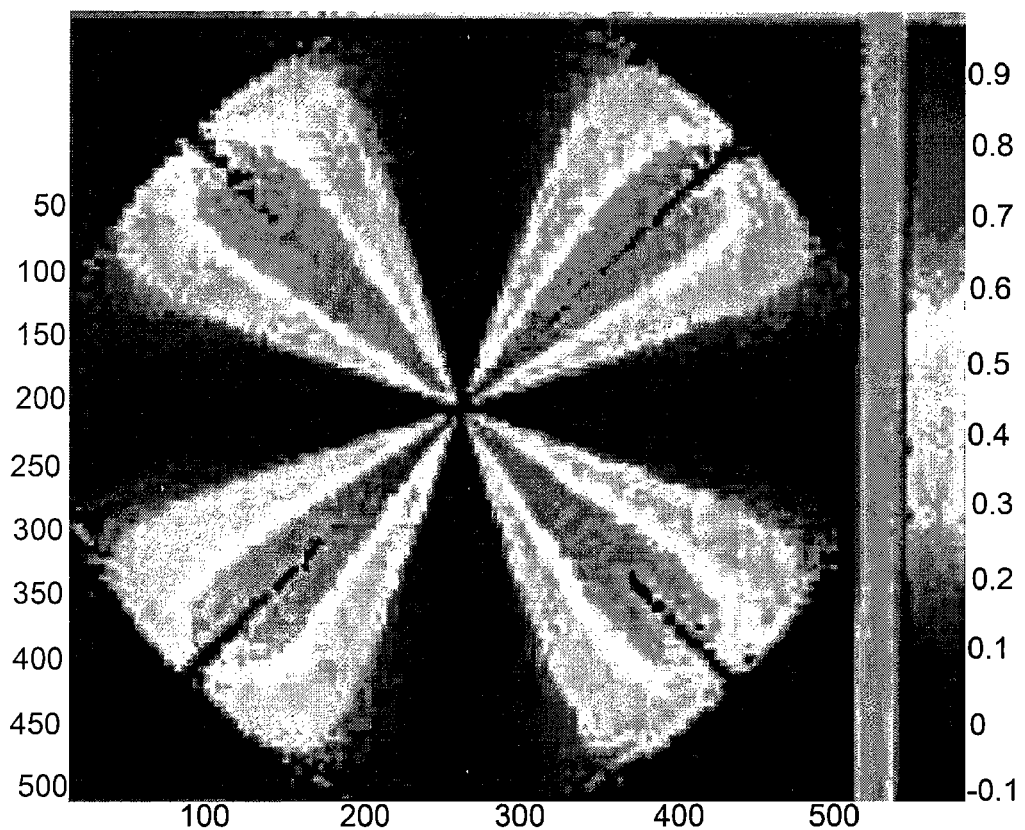
Figure 24:
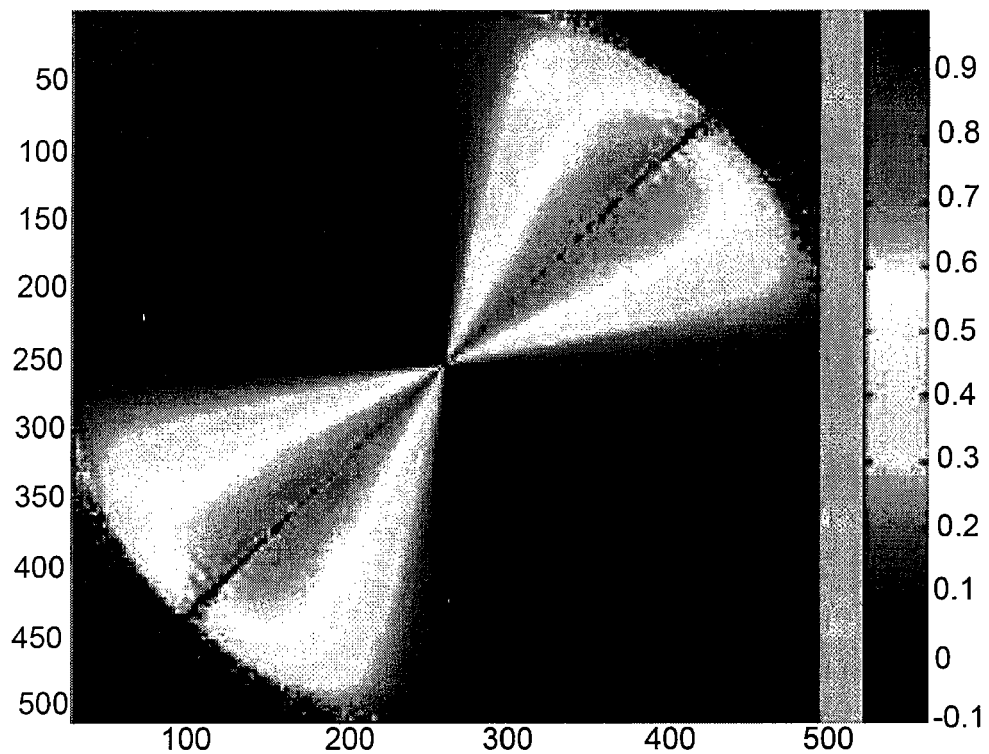

FIGS. 23 and 24 give the components q and r from which the image of d is built. Optimizing δ can be done by taking a mirror image of FIG. 22 along the diagonal. This can then be compared with (e.g., subtracted from) the original FIG. 22 to determine the difference in symmetry. In this way, it is possible to determine δ with an accuracy of 0.01 rad. The most reliable values of Δ can be derived using a phase shift of around 1.52 rad or 0.25*wavelength.

In summary, among the benefits of using an ellipsometer that creates elliptically polarized radiation (and especially of using the Δ output data) is that scatterometers may be greatly improved in their performance and accuracy. Many calibration steps used in prior art instruments may be omitted, and this especially applies to the mirror reflection map. Even dust particles on the objective lens of an ellipsometer as described above does not have any effect on the measurement of Δ. This simplifies the overall method in the reconstruction of structures on the substrate and also increases the final accuracy of the reconstruction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool, and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications such as, for example, imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure, or a combination thereof. The patterning device is moved out of the resist leaving a pattern in it after the resist is cured.

The terms "radiation" and "beam", as well as "light" used herein encompass all types of electromagnetic radiation, including ultraviolet (UV) radiation (e.g., having a wavelength of or about 365, 355, 248, 193, 157, or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic, or optical disk) having such a computer program stored therein.

For example, software functionalities of a computer system involve programming, including executable codes, may be used to implement the above-described inspection methods. The software code may be executable by a general-purpose computer. In operation, the code and possibly the associated data records may be stored within a general-purpose computer platform. At other times, however, the software may be stored at other locations and/or transported for loading into an appropriate general-purpose computer system. Hence, the embodiments discussed above involve one or more software products in the form of one or more modules of code carried by at least one machine-readable medium. Execution of such codes by a processor of the computer system enables the platform to implement the functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as discussed above. Volatile media include dynamic memory, such as main memory of a computer system. Physical transmission media include coaxial cables, copper wire, and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read or send programming codes and/or data. Many of these forms of computer readable media may be involved in carrying one or more sequences of one or more instructions to a processor for execution.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An inspection apparatus configured to measure a property of a substrate, the inspection apparatus comprising:
    a radiation source configured to supply a plurality of polarized radiation beams comprising a first polarization direction and a second polarization direction;
    an optical element configured to focus the plurality of polarized radiation beams onto the substrate, such that the plurality of radiation beams reflect at a range of incident angles and at a range of azimuth angles;
    a fixed phase-shifter configured to retard the first polarization direction by a predetermined amount so as to impose a fixed phase shift on the plurality of polarized radiation beams; and
    a detector system configured to simultaneously detect an angle-resolved spectrum of the first and second polarization directions of the reflected plurality of polarized radiation beams for the range of incident angles and the range of azimuth angles.

2. The inspection apparatus according to claim 1, wherein the range of incident angles includes 0 to 80 degrees and the range of azimuth angles includes 0 to 360 degrees.

3. The inspection apparatus according to claim 1, wherein the fixed phase shift is at least one of 90 and 270 degrees.

4. The inspection apparatus according to claim 1, wherein the phase-shifter comprises a quarter wave plate.

5. The inspection apparatus according to claim 1, wherein the fixed phase-shifter is configured to cause the plurality of polarized radiation beams to be elliptically polarized.

6. The inspection apparatus according to claim 1, further comprising an optical wedge configured to redirect the reflected plurality of polarized radiation beams in different directions based on polarization directions such that separate polarized reflected radiation sub-beams having different polarization directions are received at different positions on the detector system.

7. The inspection apparatus according to claim 6, further comprising a processor configured to:
measure an azimuth angle (A) of a radiation beam of the reflected plurality of polarized radiation beams;
determine a value of the phase shift ($\delta$) between the first polarization direction and the second polarization prior to reflection from the substrate surface;
calculate a difference (d) between intensities of the polarized reflected radiation sub-beams from the azimuth angle (A) and the phase shift ($\delta$);
derive a phase difference ($\Delta$) between the polarization directions of the polarized reflected radiation sub-beams from the difference between the intensities of the polarized reflected radiation sub-beams (d); and
determine a property of the substrate surface resulting from a variation from a predetermined model of the phase difference ($\Delta$) between the polarization directions of the polarized reflected radiation sub-beams.

8. The inspection apparatus according to claim 7, wherein the difference (d) between the intensities of the polarized reflected radiation sub-beams is calculated from the azimuth angle (A) and the phase shift ($\delta$) using the following function:

$$d=I_y-I_x=\{Rp^2(\cos(A)^4-\cos(A)^2\sin(S)^2)+Rs^2(\sin(A)^4-\cos(A)^2\sin(A)^2)\}\cos(\delta)$$

wherein the difference (d) has diagonal symmetry.

9. The inspection apparatus according to claim 7, wherein the phase difference ($\Delta$) between the polarization directions of the polarized reflected radiation sub-beams is derived from the difference between the intensities of the polarized reflected radiation sub-beams (d) using the following equation:

$$d=I_y-I_x=\{Rp^2(\cos(A)^4-\cos(A)^2\sin(A)^2)+Rs^2(\sin(A)^4-\cos(A)^2\sin(A)^2)\}\cos(\delta)+\ldots RpRs\{\cos(\Delta)\cos(\delta)4\cos(A)^2\sin(A)^2+\sin(\Delta)\sin(\delta)2(\cos(A)^3\sin(A)+\cos(A)\sin(A)^3)\}.$$

10. The inspection apparatus according to claim 7, wherein the processor is configured to determine the value of the phase shift ($\delta$) by:
estimating a value of the phase shift;
calculating, for each pixel of a detected image of the polarized reflected radiation sub-beams, the difference (d) in intensity (I) between each sub-beam using the phase difference ($\Delta$) between the reflectance coefficients (Rp, Rs) of the two polarized reflected radiation sub-beams and the estimated value of the phase shift ($\delta$); and
carrying out an optimization calculation to determine the correct value of the phase shift ($\delta$) based on the calculated values of the difference (d).

11. The inspection apparatus according to claim 10, wherein calculating the difference (d) in intensity (I) comprises using the following equation:

$$d=I_y-I_x=\{Rp^2(\cos(A)^4-\cos(A)^2\sin(A)^2)+Rs^2(\sin(A)^4-\cos(A)^2\sin(A)^2)\}\cos(\delta).$$

12. The inspection apparatus according to claim 6, further comprising a processor configured to:
measure an azimuth angle (A) of a radiation beam of the reflected plurality of polarized radiation beams;
detect an average intensity (m) of the polarized reflected radiation sub-beams;
derive a reflectance (Rp, Rs) of the polarized reflected radiation sub-beams from the azimuth angle (A) and the average intensity (m);
evaluate an angle ($\Psi$) between the polarization directions of the polarized reflected radiation sub-beams; and
determine a property of the substrate surface resulting from a variation from a predetermined model of the angle ($\Psi$) between the polarization directions of the polarized reflected radiation sub-beams.

13. The inspection apparatus according to claim 12, wherein the reflectance (Rp, Rs) of the polarized reflected radiation sub-beams is derived using the following equation: $m=0.5(Rp^2+Rs^2)+0.5\cos(2A)(Rp^2-Rs^2)$.

14. The inspection apparatus according to claim 12, wherein the angle ($\Psi$) between the polarization directions of the polarized reflected radiation sub-beams is evaluated using the following equation: $\tan\Psi=Rp/Rs$.

15. A method of measuring a property of a substrate, the method comprising:
reflecting a plurality of radiation beams with elliptical polarization off a surface of the substrate at a range of incident angles and at a range of azimuth angles, the polarized plurality of radiation beams having a first polarization direction and a second polarization direction;
shifting a phase of the first polarization direction relative to the phase of the second polarization direction by a fixed amount;
splitting the reflected polarized plurality of radiation beams into first and second orthogonally polarized sub-beams; and
detecting the first and second orthogonally polarized sub-beams for the range of incident angles and the range of azimuth angles.

16. The method according to claim 15, further comprising:
measuring an azimuth angle (A) of a radiation beam of the reflected polarized plurality of radiation beams;
detecting an intensity (m) of the first and second orthogonally polarized sub-beams;
deriving a reflectance of the first and second orthogonally polarized sub-beams (Rp, Rs) from the azimuth angle (A) and the intensity (m);
evaluating an angle ($\Psi$) between the two polarization directions of the first and second orthogonally polarized sub-beams; and
determining a property of the surface of the substrate resulting from a variation from a predetermined model of the angle ($\Psi$) between polarization directions of the first and second orthogonally polarized sub-beams.

17. The method according to claim 16, wherein:
the reflectance of the first and second orthogonally polarized sub-beams (Rp, Rs) is derived with the following equation:

$$m=0.5(Rp^2+Rs^2)+0.5\cos(2A)(Rp^2-Rs^2); \text{ and}$$

the angle ($\Psi$) between the two polarization directions of the two sub-beams is evaluated using the following equation:

$$\tan\Psi=Rp/Rs.$$

18. The method according to claim 15, further comprising:
measuring an azimuth angle (A) of a radiation beam of the reflected polarized plurality of radiation beams;

determining a value of the phase shift (δ) between the first polarization direction and the second polarization direction of the polarized radiation beam prior to reflection from the substrate surface;

calculating a difference (d) between the intensities of the first and second orthogonally polarized sub-beams;

deriving a phase difference (Δ) between the polarization directions of the first and second orthogonally polarized sub-beams; and determining a property of the substrate surface resulting from a variation from a predetermined model of the phase difference (Δ) between the polarization directions of the first and second orthogonally polarized sub-beams.

19. The method according to claim 18, wherein:

the difference (d) between the intensities of the first and second orthogonally polarized sub-beams is calculated using the following equation:

$$d = I_y - I_x; \text{ and}$$

the phase difference (Δ) between the polarization directions of the first and second orthogonally polarized sub-beams is derived using the following equation:

$$d = I_y - I_x = \{Rp^2(\cos(A)^4 - \cos(A)^2\sin(A)^2) + Rs^2(\sin(A)^4 - \cos(A)^2\sin(A)^2)\}\cos(\delta) + \ldots RpRs\{\cos(\Delta)\cos(\delta)4\cos(A)^2\sin(A)^2 + \sin(\Delta)\sin(\delta)2(\cos(A)^3\sin(A) + \cos(A)\sin(A)^3)\}.$$

20. The method according to claim 18, wherein determining the value of the phase shift (δ) comprises:

estimating a value of the phase shift (δ) of the radiation beam;

calculating a value of the difference (d) for each pixel of a detected image of the first and second orthogonally polarized sub-beams from the difference (d) in intensity (I) between the first and second orthogonally polarized sub-beams, the phase difference (Δ) between the reflectance coefficients (Rp,Rs) of the first and second orthogonally polarized sub-beams, and the estimated value of the phase shift (δ); and determining an optimization calculation to determine a correct value of the phase shift (δ) based on the calculated values of the difference (d).

21. The method according to claim 20, wherein the value for the difference (d) is calculated using the following equation: $d = I_y - I_x$.

22. The method according to claim 20, wherein the optimization calculation comprises determining whether an image made up of the value of the difference (d) for each pixel comprises non-zero values on the diagonals and zero on the x and y axes and if not, readjusting the estimated value of the phase shift (δ), recalculating the values of the difference (d) and repeating this iteration until the image made up of the values of the difference (d) comprises non-zero values on the diagonals and zero on the x and y axes.

23. The method according to claim 20, wherein the estimated value of the phase shift (δ) of the first orthogonally polarized sub-beam is 1.5 radians.

24. A lithographic apparatus configured to measure a property of a substrate, the lithographic apparatus comprising:

a radiation source configured to supply a plurality of polarized radiation beams comprising first and second polarization orientations;

an optical element configured to focus the plurality of polarized radiation beams onto the substrate, such that the plurality of polarized radiation beams reflect at a range of incident angles and at a range azimuth angle;

a phase-shifter with a fixed phase shift configured to shift the phase of the first polarization orientation of the plurality of polarized radiation beams by a predetermined amount; and a detector system configured to simultaneously detect an angle-resolved spectrum of the first and second polarization orientations of the plurality of reflected polarized radiation beams for the range of incident angles and the range of azimuth angles.

25. A lithographic cell configured to measure a property of a substrate, the lithographic cell comprising:

a radiation source configured to supply a plurality of polarized radiation beams comprising first and second polarization orientations;

an optical element configured to focus the radiation beam onto the substrate, such that the plurality of radiation beams reflect at a range of incident angles and at a range of azimuth angles;

a phase-shifter with a fixed phase shift configured to shift the phase of the first polarization orientation of the plurality of polarized radiation beams by a predetermined amount; and a detector system configured to simultaneously detect an angle-resolved spectrum of the first and second polarization orientations of the reflected plurality of polarized radiation beams for the range of incident angles and the range of azimuth angles.

* * * * *

UNITED STATES PATENT AND TRADEMARK OFFICE
CERTIFICATE OF CORRECTION

PATENT NO. : 8,115,926 B2  
APPLICATION NO. : 12/256780  
DATED : February 14, 2012  
INVENTOR(S) : Alexander Straaijer Page 1 of 1

It is certified that error appears in the above-identified patent and that said Letters Patent is hereby corrected as shown below:

In col. 22, line 17, claim 14, please delete "12" and insert --13--

Signed and Sealed this  
Tenth Day of April, 2012

David J. Kappos  
*Director of the United States Patent and Trademark Office*